United States Patent
Campbell et al.

(10) Patent No.: US 9,173,324 B2
(45) Date of Patent: Oct. 27, 2015

(54) DEHUMIDIFYING COOLING APPARATUS AND METHOD FOR AN ELECTRONICS RACK

(71) Applicant: INTERNATIONAL BUSINESS MACHINES CORPORATION, Armonk, NY (US)

(72) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Foster City, CA (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/063,154

(22) Filed: Oct. 25, 2013

(65) Prior Publication Data

US 2014/0049917 A1   Feb. 20, 2014

Related U.S. Application Data

(62) Division of application No. 12/787,807, filed on May 26, 2010.

(51) Int. Cl.
*F25D 23/12* (2006.01)
*H05K 7/20* (2006.01)
(Continued)

(52) U.S. Cl.
CPC .............. *H05K 7/202* (2013.01); *F28D 1/0471* (2013.01); *F28D 1/0475* (2013.01); *F28F 1/126* (2013.01);
(Continued)

(58) Field of Classification Search
CPC .......... H05K 7/20781; H05K 7/20763; H05K 7/20627; H05K 7/20572; H05K 7/20218; H05K 7/20645; H05K 7/20736; F28D 1/0471; F28D 2021/0038; F28F 17/005; F28F 1/126; F28F 1/32

USPC ................ 361/691, 690, 696, 698, 701, 703; 62/92, 259.2, 272, 285, 288, 290, 291, 62/91, 93; 165/181, 151, 152
See application file for complete search history.

(56) References Cited

U.S. PATENT DOCUMENTS 1,516,893 A   11/1924   Sage
1,553,093 A   9/1925   Modine
(Continued)

FOREIGN PATENT DOCUMENTS

WO   WO 2008/105760 A2   9/2008

OTHER PUBLICATIONS

"Rack Cooler—A cool Solution for X-Treme Density Rack Enclosure Systems", Liebert Corporation, Product Brochure, 2001 (8 pages).
(Continued)

*Primary Examiner* — Cheryl J Tyler
*Assistant Examiner* — Orlando E Aviles Bosques
(74) *Attorney, Agent, or Firm* — Steven Chiu, Esq.; Kevin P. Radigan, Esq.; Heslin Rothenberg Farley & Mesiti P.C.

(57) ABSTRACT

Dehumidifying cooling apparatus and method are provided for an electronics rack. The apparatus includes an air-to-liquid heat exchanger disposed at an air inlet or outlet side of the rack, wherein air flows through the rack from the air inlet to the air outlet side. The heat exchanger is positioned for air passing through the electronics rack to pass across the heat exchanger, and is in fluid communication with a coolant loop for passing coolant therethrough at a temperature below a dew point temperature of the air passing across the heat exchanger so that air passing across the heat exchanger is dehumidified and cooled. A condensate collector, disposed below the heat exchanger, collects liquid condensate from the dehumidifying of air passing through the electronics rack, wherein the heat exchanger includes a plurality of sloped surfaces configured to facilitate drainage of liquid condensate from the heat exchanger to the condensate collector.

11 Claims, 26 Drawing Sheets

(51) Int. Cl.
*F28D 1/047* (2006.01)
*F28F 1/12* (2006.01)
*F28F 1/32* (2006.01)
*F28F 17/00* (2006.01)
*F28D 1/053* (2006.01)
*F28D 21/00* (2006.01)

(52) U.S. Cl.
CPC ............... *F28F 1/32* (2013.01); *F28F 17/005* (2013.01); *H05K 7/20218* (2013.01); *H05K 7/20318* (2013.01); *H05K 7/20572* (2013.01); *H05K 7/20609* (2013.01); *H05K 7/20627* (2013.01); *H05K 7/20645* (2013.01); *H05K 7/20736* (2013.01); *H05K 7/20754* (2013.01); *H05K 7/20763* (2013.01); *H05K 7/20781* (2013.01); *H05K 7/20836* (2013.01); *F28D 1/05366* (2013.01); *F28D 2021/0038* (2013.01)

(56) References Cited

U.S. PATENT DOCUMENTS

| | | |
|---|---|---|
| 2,667,041 A | 1/1954 | Henderson |
| 3,740,959 A | 6/1973 | Foss |
| 3,868,830 A | 3/1975 | Fletcher et al. |
| 4,011,905 A | 3/1977 | Millard |
| 4,135,370 A | 1/1979 | Hosoda et al. |
| 4,296,803 A | 10/1981 | Sumitomo |
| 4,952,283 A | 8/1990 | Besik |
| 5,056,593 A | 10/1991 | Hull |
| 5,131,233 A | 7/1992 | Cray et al. |
| 5,285,347 A | 2/1994 | Fox et al. |
| 5,467,250 A | 11/1995 | Howard et al. |
| 5,613,372 A | 3/1997 | Beal et al. |
| 5,731,954 A | 3/1998 | Cheon |
| 5,934,368 A | 8/1999 | Tanaka et al. |
| 5,970,731 A | 10/1999 | Hare et al. |
| 6,164,369 A | 12/2000 | Stoller |
| 6,176,098 B1 | 1/2001 | Moriguchi |
| 6,205,796 B1 | 3/2001 | Chu et al. |
| 6,272,016 B1 | 8/2001 | Matonis et al. |
| 6,377,453 B1 | 4/2002 | Belady |
| 6,462,944 B1 | 10/2002 | Lin |
| 6,490,874 B2 | 12/2002 | Chu et al. |
| 6,535,382 B2 | 3/2003 | Bishop et al. |
| 6,621,707 B2 | 9/2003 | Ishimine et al. |
| 6,628,520 B2 | 9/2003 | Patel et al. |
| 6,760,221 B2 | 7/2004 | Goth et al. |
| 6,775,137 B2 | 8/2004 | Chu et al. |
| 6,778,394 B2 | 8/2004 | Oikawa et al. |
| 6,819,563 B1 | 11/2004 | Chu et al. |
| 6,973,801 B1 | 12/2005 | Campbell et al. |
| 7,000,467 B2 | 2/2006 | Chu et al. |
| 7,002,799 B2 | 2/2006 | Malone et al. |
| 7,086,247 B2 | 8/2006 | Campbell et al. |
| 7,104,081 B2 | 9/2006 | Chu et al. |
| 7,277,282 B2 | 10/2007 | Tate |
| 7,353,861 B2 | 4/2008 | Chu et al. |
| 7,355,852 B2 | 4/2008 | Pfahnl |
| 7,385,810 B2 | 6/2008 | Chu et al. |
| 7,450,385 B1 | 11/2008 | Campbell et al. |
| 7,542,290 B2 | 6/2009 | Tracy et al. |
| 7,848,106 B2 | 12/2010 | Merrow |
| 2,895,855 A1 | 3/2011 | Gooch |
| 7,905,096 B1 | 3/2011 | Campbell et al. |
| 8,004,839 B2 | 8/2011 | Sato et al. |
| 8,033,122 B2 | 10/2011 | Bean, Jr. |
| 8,189,334 B2 | 5/2012 | Campbell et al. |
| 8,307,669 B2 | 11/2012 | Taras et al. |
| 2004/0177948 A1 | 9/2004 | Cho et al. |
| 2005/0217299 A1 | 10/2005 | Chu et al. |
| 2005/0231913 A1 | 10/2005 | Malone et al. |
| 2008/0232069 A1 | 9/2008 | Chu et al. |
| 2008/0276656 A1 | 11/2008 | Kitamura et al. |
| 2009/0080173 A1 | 3/2009 | Porter et al. |
| 2009/0097205 A1 | 4/2009 | Matsushima et al. |
| 2010/0012305 A1* | 1/2010 | Taras et al. .................. 62/285 |
| 2011/0290448 A1 | 12/2011 | Campbell et al. |
| 2014/0049914 A1 | 2/2014 | Campbell et al. |

OTHER PUBLICATIONS

Teague, Paul E., "One Cool Machine", Design News for Mechanical and Design Engineers, Internet Article, dated Feb. 7, 2005 (6 pages).

Campbell et al., Notice of Allowance for U.S. Appl. No. 12/787,828, filed May 26, 2010 (U.S. Pat. No. 7,905,096 B1), dated Nov. 12, 2010 (11 pages).

Campbell et al., Notice of Allowance for U.S. Appl. No. 12/787,839, filed May 26, 2010 (U.S. Pat. No. 8,144,467 B2), dated Nov. 30, 2011 (16 pages).

Campbell et al., Office Action for U.S. Appl. No. 12/787,790, filed May 26, 2010 (U.S. Pat. No. 8,189,334 B2), dated Dec. 23, 2011 (56 pages).

Campbell et al., Notice of Allowance for U.S. Appl. No. 12/787,790, filed May 26, 2010 (U.S. Pat. No. 8,189,334 B2), dated Jan. 24, 2012 (9 pages).

Campbell et al., Restriction Requirement for U.S. Appl. No. 12/787,807, filed May 26, 2010 (U.S. Patent Publication No. 2011/0290448 A1), dated Jul. 2, 2013 (6 pages).

Campbell et al., Office Action for U.S. Appl. No. 12/787,807, filed May 26, 2010 (U.S. Patent Publication No. 2011/0290448 A1), dated Oct. 22, 2013 (27 pages).

Campbell et al., Applicant-Initiated Interview Summary for U.S. Appl. No. 12/787,807, filed May 26, 2010 (U.S. Patent Publication No. 2011/0290448 A1), dated Aug. 12, 2014 (3 pages).

Campbell et al., Office Action for U.S. Appl. No. 12/787,807, filed May 26, 2010 (U.S. Patent Publication No. 2011/0290448 A1), dated Apr. 29, 2014 (13 pages).

Campbell et al., Office Action for U.S. Appl. No. 14/063,123, filed Oct. 25, 2013 (U.S. Patent Publication No. 2014/0049914 A1), dated Mar. 11, 2015 (21 pages).

Campbell et al., Office Action for U.S. Appl. No. 14/063,123, filed Oct. 25, 2013 (U.S. Patent Publication No. 2014/0049914 A1), dated Jun. 24, 2015 (15 pages).

Campbell et al., Office Action for U.S. Appl. No. 14/063,141, filed Aug. 14, 2013 (U.S. Patent Publication No. 2014/0055949 A1), dated Aug. 14, 2015 (24 pages).

* cited by examiner

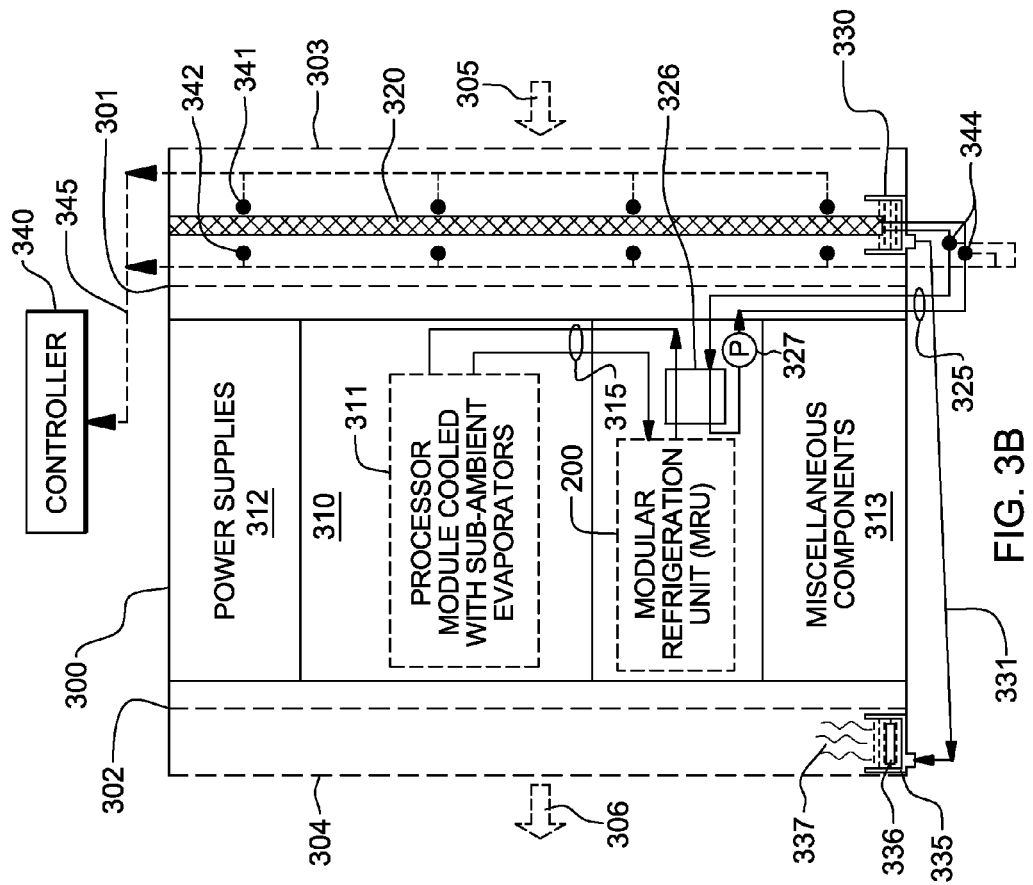
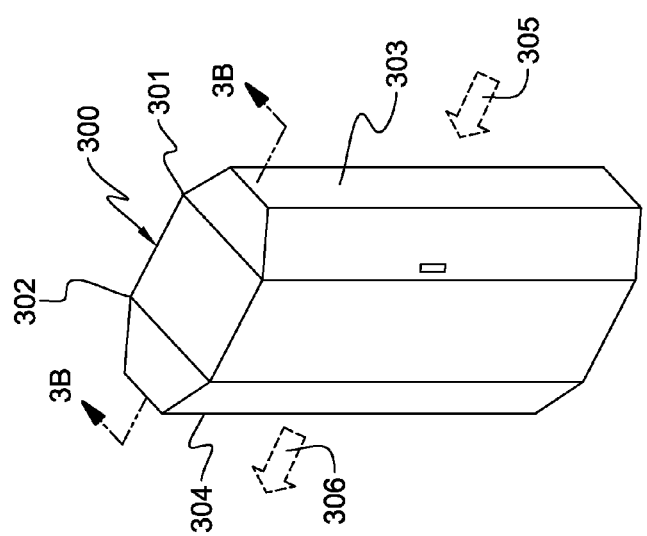

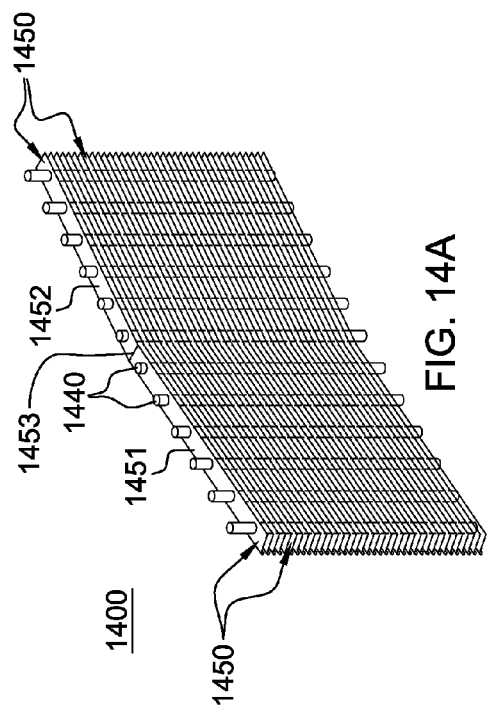
FIG. 14A
FIG. 14B
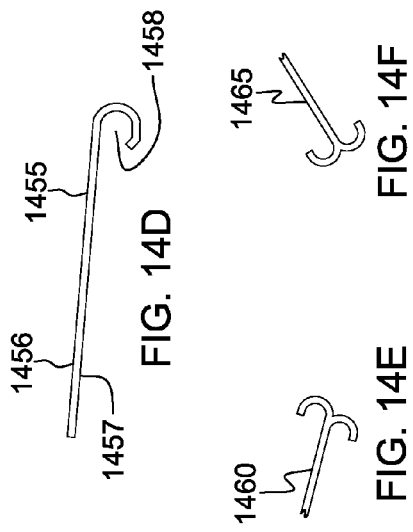
FIG. 14D
FIG. 14E
FIG. 14F
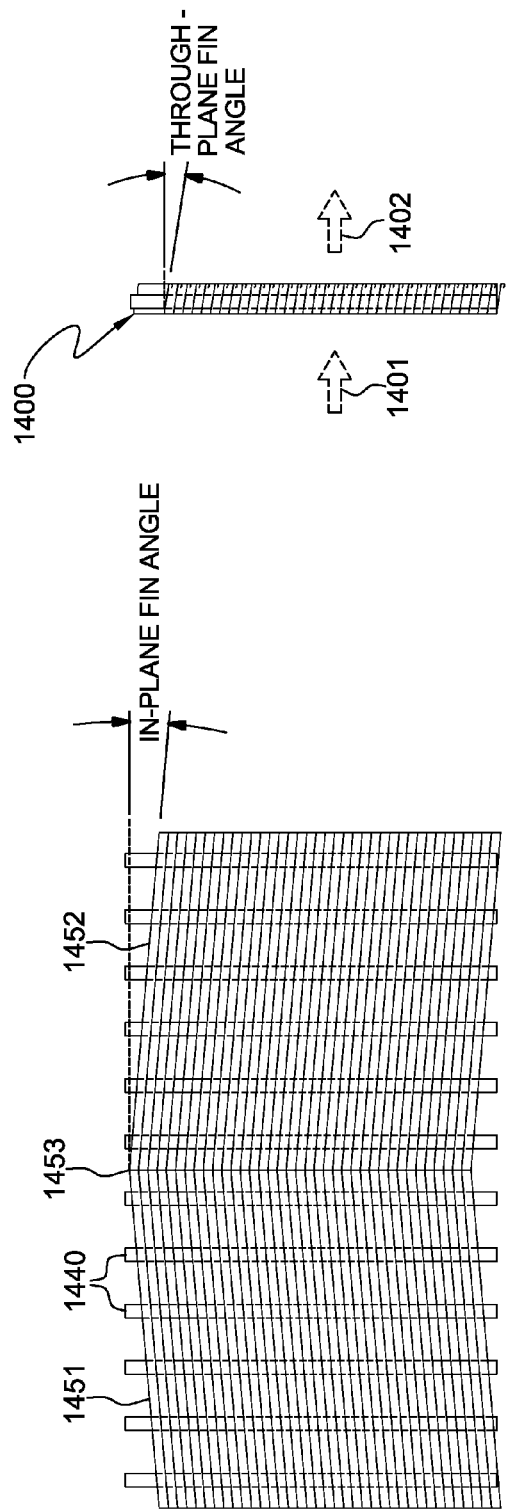
FIG. 14C

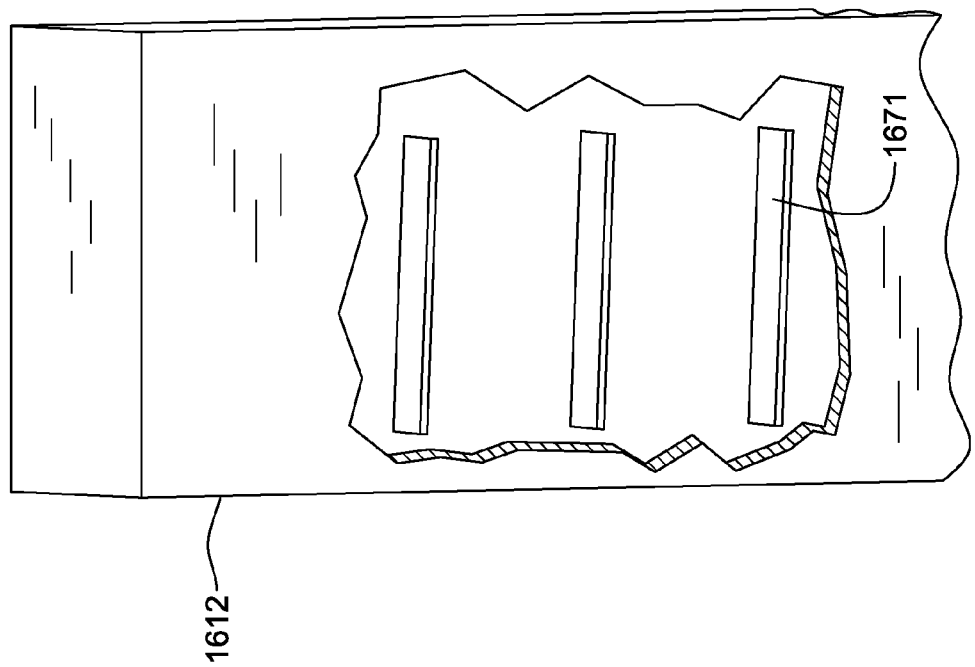
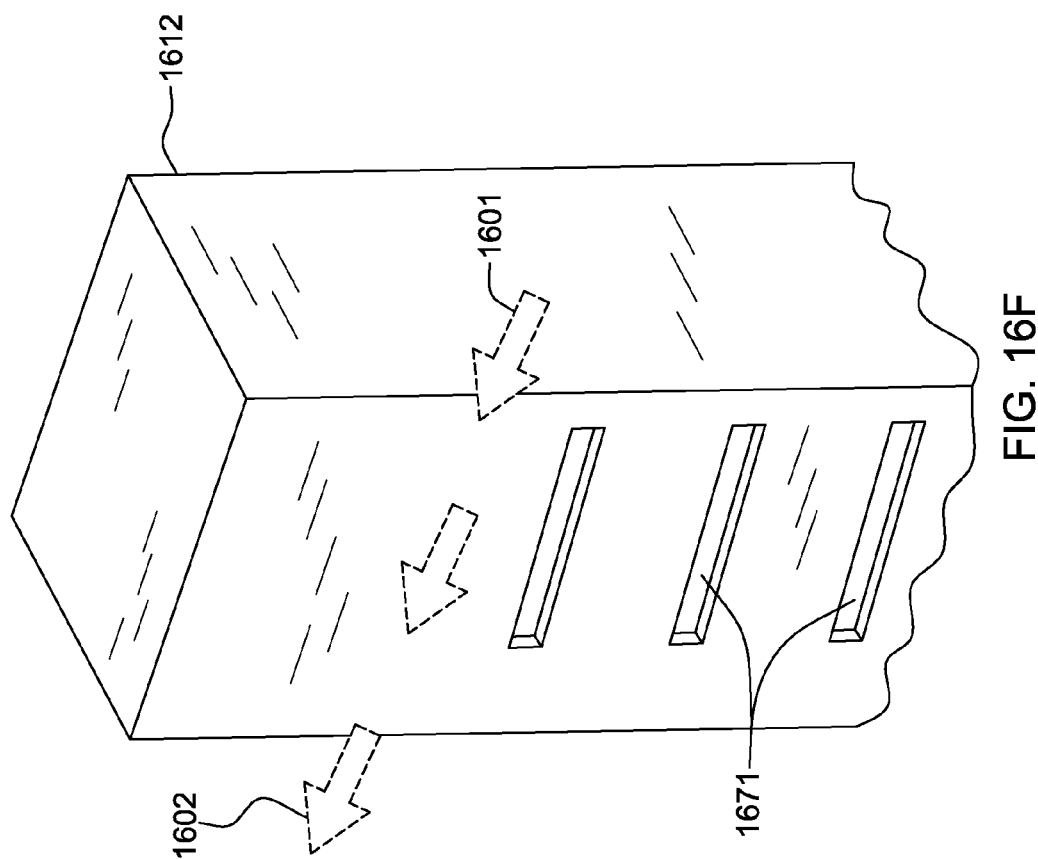
FIG. 16F
FIG. 16G

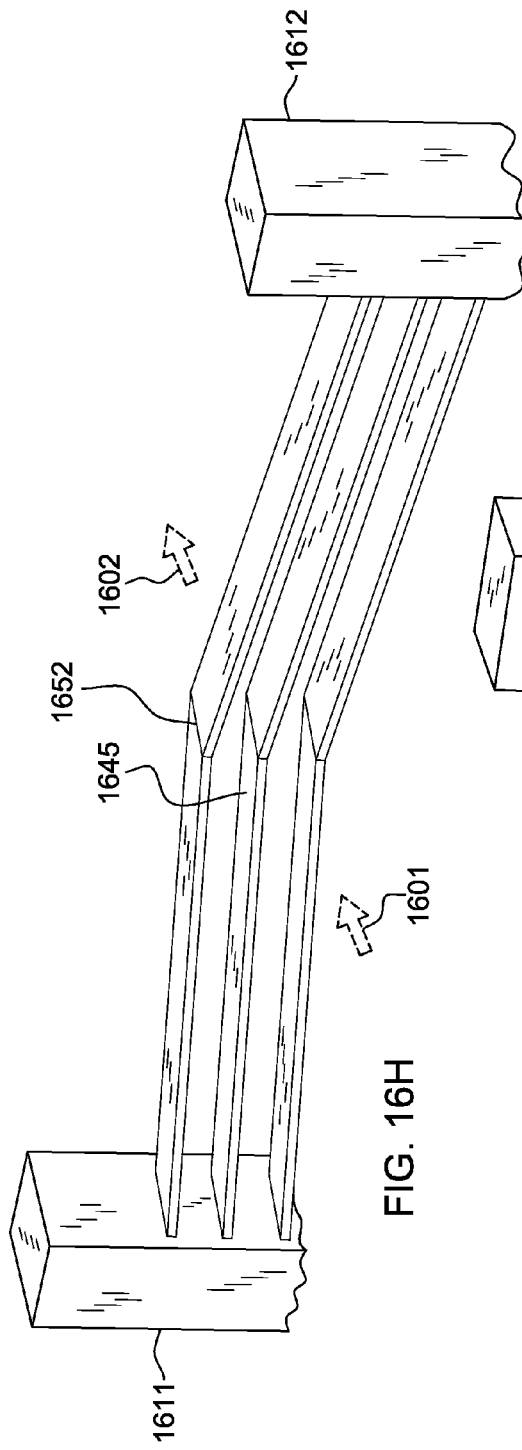
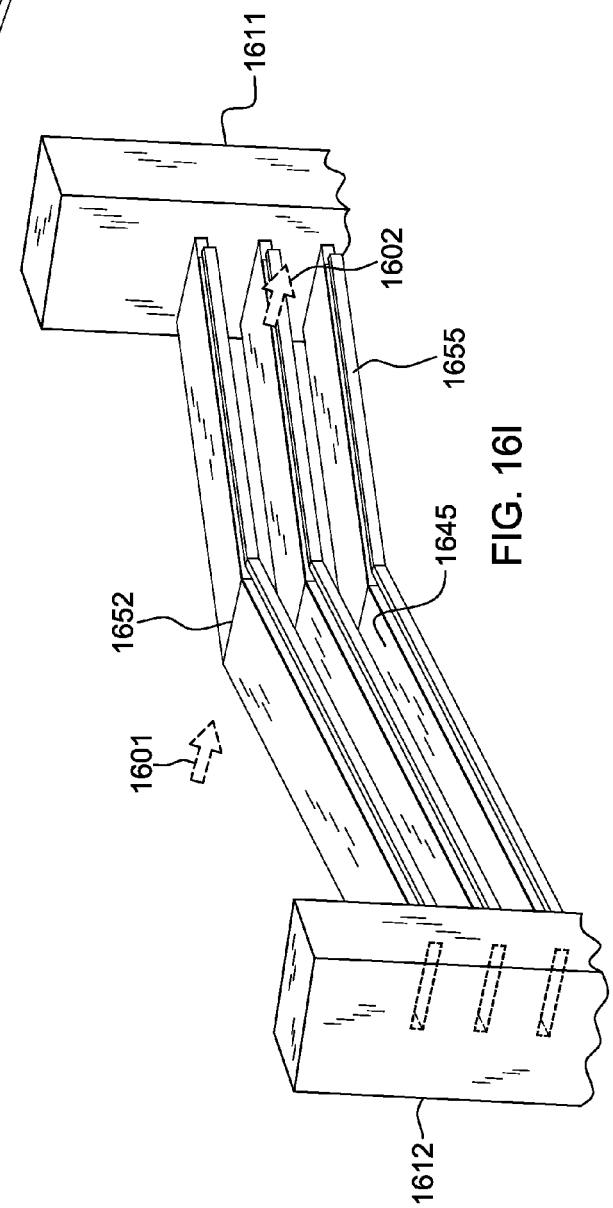
FIG. 16H
FIG. 16I

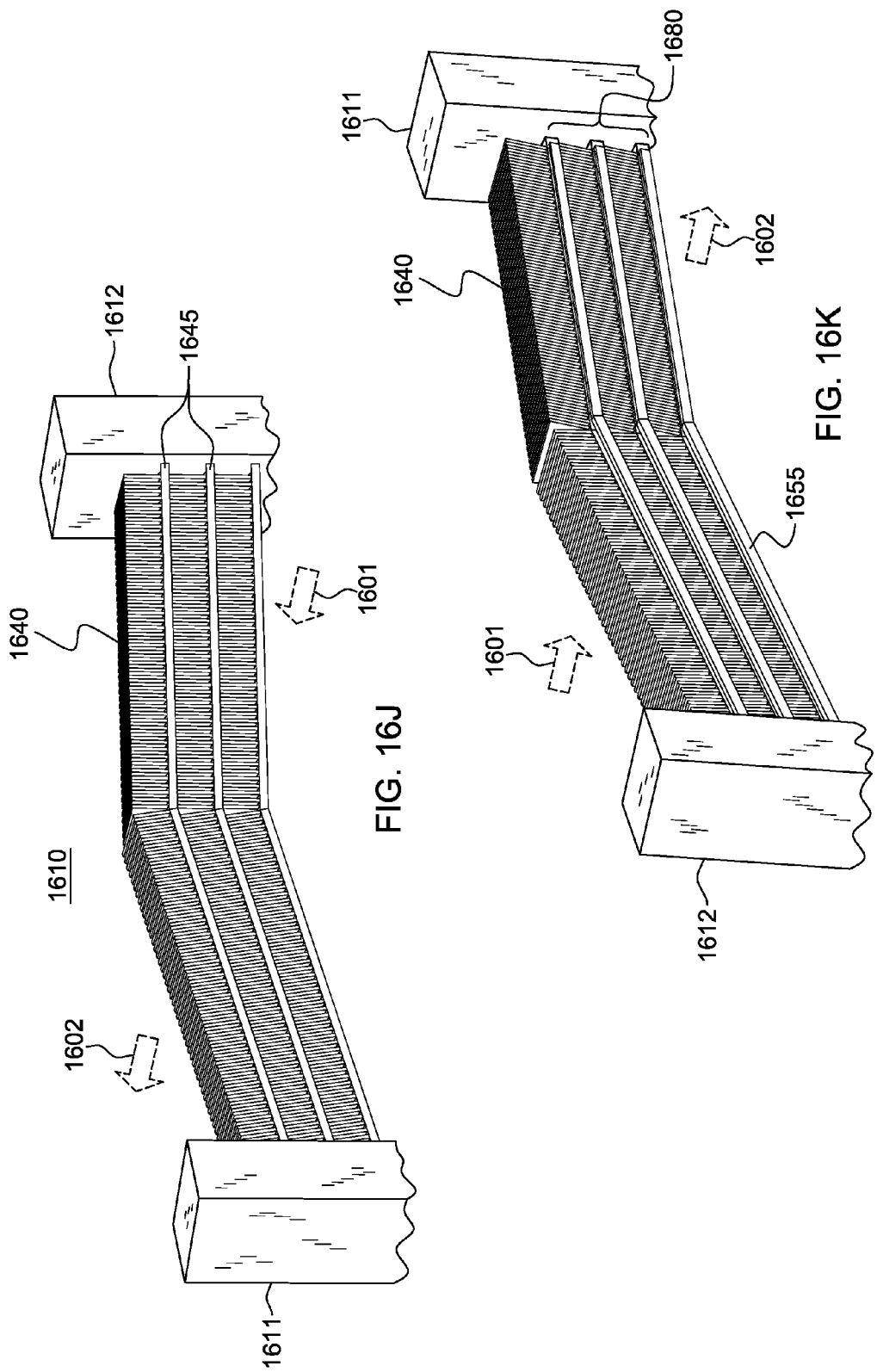

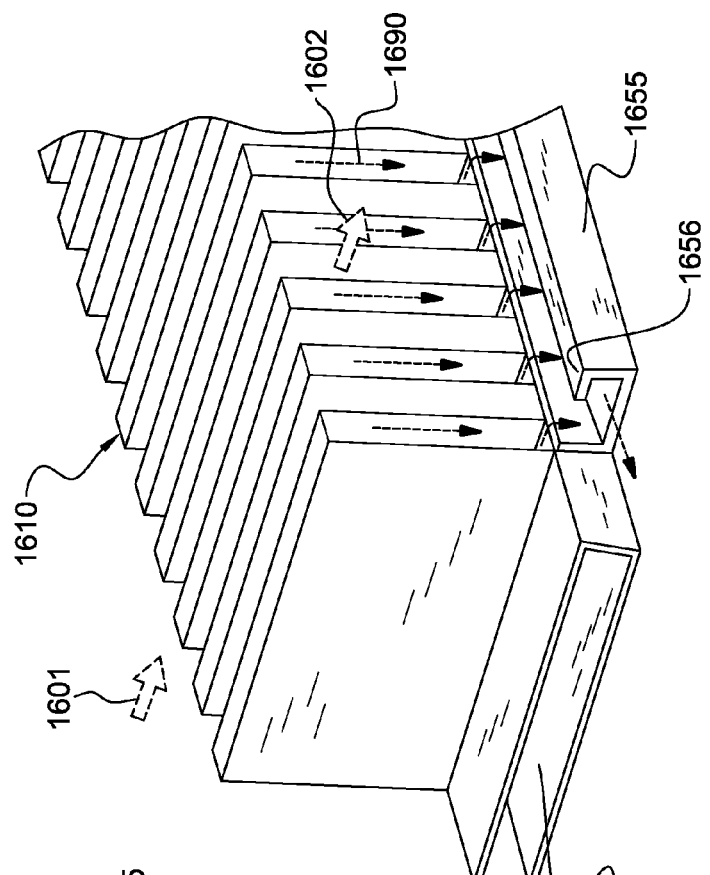
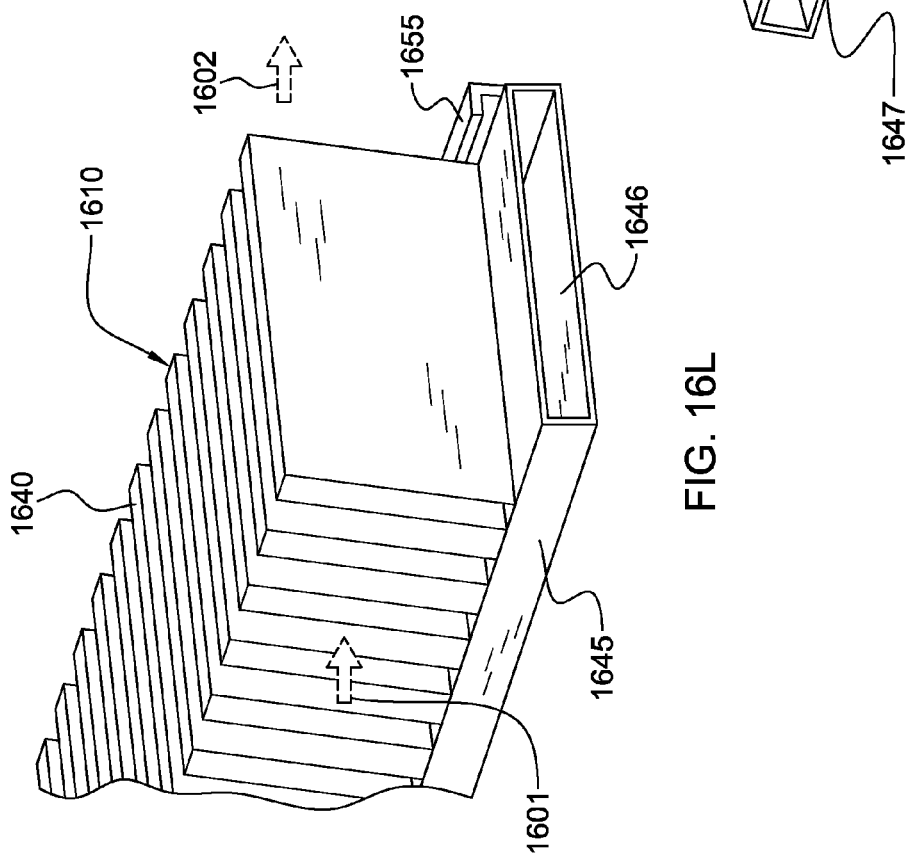

DEHUMIDIFYING COOLING APPARATUS AND METHOD FOR AN ELECTRONICS RACK

CROSS-REFERENCE TO RELATED APPLICATION

This application is a divisional of U.S. application Ser. No. 12/787,807, entitled "DEHUMIDIFYING COOLING APPARATUS AND METHOD FOR AN ELECTRONICS RACK", filed May 26, 2010, which published Dec. 1, 2011, as U.S. Patent Publication No. 2011/0290448 A1, and which is hereby incorporated herein by reference in its entirety.

BACKGROUND

The present invention relates in general to cooling of an electronics rack(s) of a data center, including rack-mounted assemblages of individual electronics units, such as rack-mounted computer server units.

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of the air that is exhausted into the data center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow through the use of a more powerful air moving device or by increasing the rotational speed (i.e., RPMs) of an existing air moving device. However, this approach is becoming problematic at the electronic component and at the rack level in the context of a computer installation (e.g., a data center).

For example, the sensible heat load carried by the air exiting the rack is stressing the ability of the room air-conditioning to effectively handle the load. This is especially true for large installations with "server farms" or large banks of computer racks close together. In such installations, liquid cooling (e.g., refrigerant or water-cooling) is an attractive technology to manage the higher heat fluxes of selected high heat flux electronic components within the electronics rack. The liquid coolant absorbs the heat dissipated by the high heat flux components/modules in an efficient manner, with the heat typically being transferred from the liquid coolant to an outside environment, whether air or other liquid coolant.

BRIEF SUMMARY

In one aspect, an apparatus is provided herein for facilitating cooling of an electronics rack. The apparatus includes an air-to-liquid heat exchanger and a condensate collector. The air-to-liquid heat exchanger is configured to reside at one of an air inlet side or an air outlet side of the electronics rack, wherein air moves through the electronics rack from the air inlet side to the air outlet side thereof. The heat exchanger, when disposed at the electronics rack, is positioned for air passing through the electronics rack to pass across the air-to-liquid heat exchanger, and being in fluid communication with a coolant loop for passing coolant therethrough. The coolant passing through the air-to-liquid heat exchanger has a temperature below a dew point temperature of the air passing across the air-to-liquid heat exchanger, wherein air passing across the air-to-liquid heat exchanger is dehumidified and cooled by the air-to-liquid heat exchanger. The condensate collector is disposed below the air-to-liquid heat exchanger for collecting liquid condensate from the air-to-liquid heat exchanger's dehumidifying of air passing through the electronics rack. The air-to-liquid heat exchanger includes a plurality of sloped surfaces, which are angled to facilitate drainage of liquid condensate from the air-to-liquid heat exchanger to the condensate collector. Further, the air-to-liquid heat exchanger includes a plurality of coolant-carrying tubes. The plurality of coolant-carrying tubes are substantially horizontally-oriented, and at least one coolant-carrying tube of the plurality of coolant-carrying tubes includes at least one sloped surface of the plurality of sloped surfaces for facilitating drainage of liquid condensate from a central region of the air-to-liquid heat exchanger towards at least one of a first vertical edge or a second vertical edge of the air-to-liquid heat exchanger.

In another aspect, a cooled electronic system is provided which includes an electronics rack and a dehumidifying cooling apparatus for the electronics rack. The electronics rack includes an air inlet side and an air outlet side for respectively enabling ingress and egress of air, at least one electronic component requiring cooling, and at least one air-moving device. The at least one air-moving device causes air to flow from the air inlet side of the electronics rack through the electronics rack, to the air outlet side thereof. The dehumidifying cooling apparatus includes an air-to-liquid heat exchanger and a condensate collector. The air-to-liquid heat exchanger is disposed at one of the air inlet side or the air outlet side of the electronics rack and is positioned for air passing through the electronics rack to pass across the air-to-liquid heat exchanger. The air-to-liquid heat exchanger is in fluid communication with a coolant loop for passing coolant therethrough, and the coolant passing through the air-to-liquid heat exchanger has a temperature below a dew point temperature of the air passing across the air-to-liquid heat exchanger, wherein air passing across the air-to-liquid heat exchanger is dehumidified and cooled by the air-to-liquid heat exchanger. The condensate collector is disposed below the air-to-liquid heat exchanger for collecting liquid condensate from the air-to-liquid heat exchanger's dehumidifying of air passing through the electronics rack, and the air-to-liquid heat exchanger includes a plurality of sloped surfaces which are angled to facilitate drainage of liquid condensate from the air-to-liquid heat exchanger to the condensate collector. The air-to-liquid heat exchanger further includes a plurality of coolant-carrying tubes. The plurality of coolant-carrying tubes are substantially horizontally-oriented, and at least one coolant-carrying tube of the plurality of coolant-carrying tubes includes at least one sloped surface of the plurality of sloped surfaces, which facilitates drainage of liquid condensate from a central region of the air-to-liquid heat exchanger towards at least one of a first vertical edge or a second vertical edge of the air-to-liquid heat exchanger.

In a further aspect, a method of facilitating cooling of an electronics rack is provided. The method includes: disposing a heat exchanger at one of an air inlet side or an air outlet side of the electronics rack, wherein the electronics rack comprises the air inlet side and the air outlet side which respectively enable ingress and egress of air through the electronics rack, the disposing comprising positioning the air-to-liquid heat exchanger for air passing through the electronics rack to also pass across the air-to-liquid heat exchanger and coupling in fluid communication the air-to-liquid heat exchanger with a coolant loop for passing coolant through the air-to-liquid heat exchanger; passing coolant through the air-to-liquid heat exchanger, the coolant having a temperature below a dew point temperature of the air passing across the air-to-liquid heat exchanger, wherein the air passing across the air-to-liquid heat exchanger is dehumidified and cooled by the air-to-liquid heat exchanger; and collecting liquid condensate from the air-to-liquid heat exchanger's dehumidifying of air passing through the electronics rack in a condensate collector disposed below the air-to-liquid heat exchanger, wherein the air-to-liquid heat exchanger comprises a plurality of sloped surfaces, the plurality of sloped surfaces being angled to facilitate drainage of liquid condensate from the air-to-liquid heat exchanger to the condensate collector; and wherein the air-to-liquid heat exchanger includes a plurality of coolant-carrying tubes, the plurality of coolant-carrying tubes being substantially horizontally-oriented and at least one coolant-carrying tube of the plurality of coolant-carrying tubes including at least one sloped surface of the plurality of sloped surfaces for facilitating drainage of liquid condensate from a central region of the air-to-liquid heat exchanger towards at least one of a first vertical edge or a second vertical edge of the air-to-liquid heat exchanger.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 3A depicts one embodiment of an electronics rack to employ a dehumidifying and re-humidifying cooling apparatus, in accordance with an aspect of the present invention;

FIG. 3B is a cross-sectional elevational view of the electronics rack of FIG. 3A, taken along line 3B-3B, and illustrating one embodiment of a dehumidifying and re-humidifying cooling apparatus, in accordance with an aspect of the present invention;

FIG. 14A depicts an alternate embodiment of an air-to-liquid heat exchanger for a dehumidifying cooling apparatus, in accordance with an aspect of the present invention;

FIG. 14B is an elevational view of the air-to-liquid heat exchanger of FIG. 14A, in accordance with an aspect of the present invention;

FIG. 14C is an end elevational view of the air-to-liquid heat exchanger of FIGS. 14A & 14B, in accordance with an aspect of the present invention;

FIG. 14D is a cross-sectional view of one embodiment of an air-cooling fin for the air-to-liquid heat exchanger of FIGS. 14A-14C, in accordance with an aspect of the present invention;

FIG. 14E depicts an alternate embodiment of an air-cooling fin for the air-to-liquid heat exchanger of FIGS. 14A-14C, in accordance with an aspect of the present invention;

FIG. 14F depicts another alternate embodiment of an air-cooling fin for an air-to-liquid heat exchanger such as depicted in FIGS. 14A-14C, in accordance with an aspect of the present invention;

FIGS. 16F & 16G depict one embodiment of a coolant outlet manifold for the dehumidifying cooling apparatus of FIG. 16A, in accordance with an aspect of the present invention;

FIG. 16H depicts, from the air ingress side of the air-to-liquid heat exchanger, a partial assembly of the substantially horizontally-oriented, coolant-carrying tubes and the coolant inlet and outlet manifolds of FIGS. 16C-16G, in accordance with an aspect of the present invention;

FIG. 16I depicts the partial assembly of FIG. 16H from the air egress side of the assembly, in accordance with an aspect of the present invention;

FIG. 16J depicts the partial assembly of FIG. 16H, shown from the air ingress side of the assembly, with thermally conductive folded fin arrays positioned in contact with respective horizontally-oriented, coolant-carrying tubes, in accordance with an aspect of the present invention;

FIG. 16K depicts the partial assembly of FIG. 16J, shown from the air egress side of the assembly, in accordance with an aspect of the present invention;

FIG. 16L is a partial illustration of one substantially horizontally-oriented, coolant-carrying tube and thermally conductive folded fin array subassembly, with a coolant collection channel disposed at one edge thereof, and shown from the air ingress side of the subassembly, in accordance with an aspect of the present invention;

FIG. 16M depicts the subassembly of FIG. 16L, shown from the air egress side of the subassembly, and illustrating liquid condensate flowing into the liquid collection channel for drainage to, for example, a vertically-oriented, condensate drainage channel of the dehumidifying cooling apparatus of FIG. 16A, in accordance with an aspect of the present invention.

DETAILED DESCRIPTION

Figure 1:
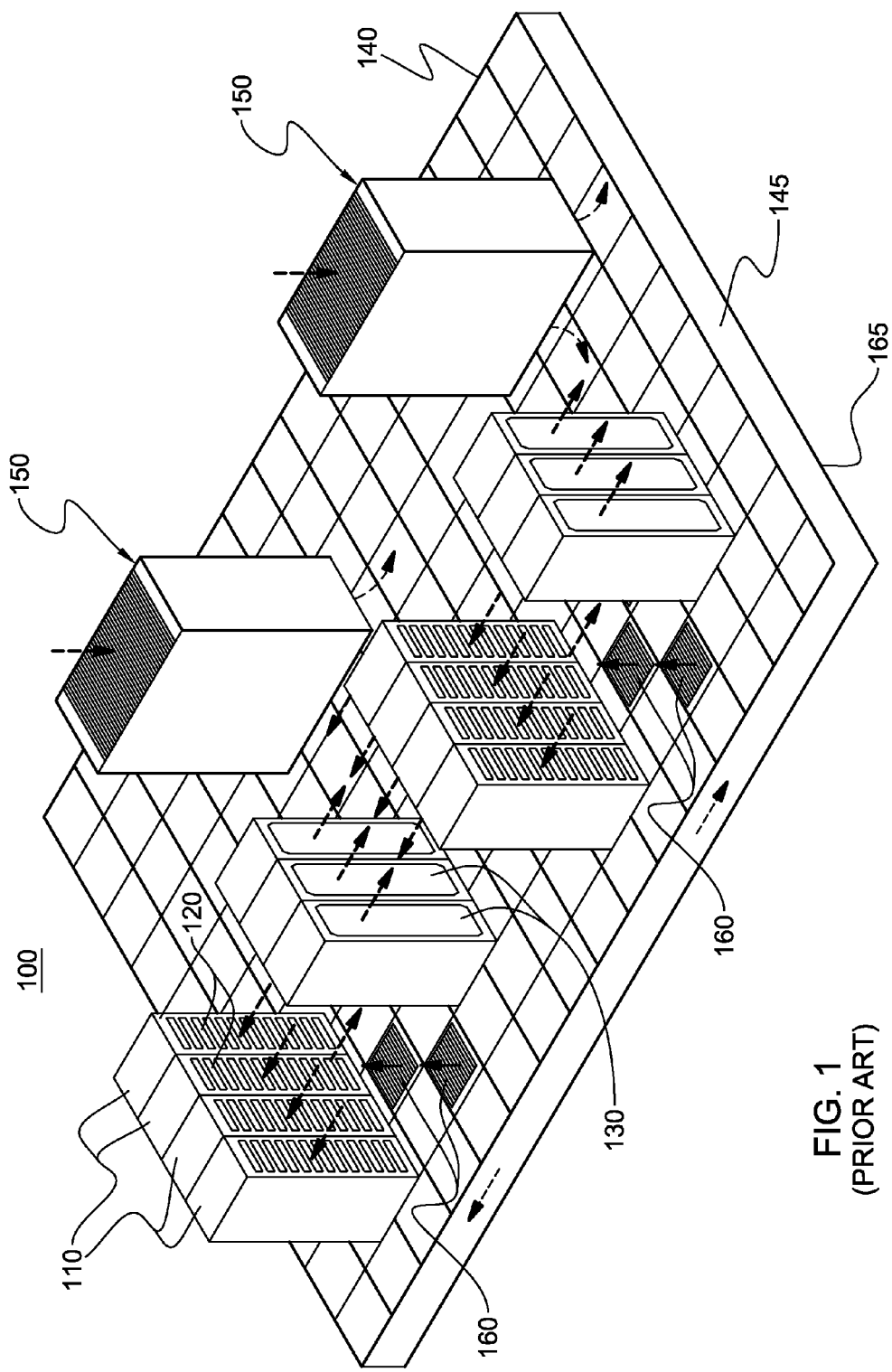
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with rack-mounted electronics drawers of a multi-drawer rack unit and blades of a blade center system being two examples of subsystems of an electronics rack to be cooled.

"Electronic component" refers to any heat generating electronic component or module of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier.

As used herein, "air-to-liquid heat exchanger" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal or mechanical contact with a plurality of air-cooled cooling or condensing fins. Size, configuration and construction of the air-to-liquid heat exchanger can vary without departing from the scope of the invention disclosed herein. A "liquid-to-liquid heat exchanger" may comprise, for example, two or more separate coolant flow paths, formed of thermally conductive tubings (such as copper or other tubing) in thermal communication with each other. Size, configuration and construction of the liquid-to-liquid heat exchanger can vary without departing from the scope of the invention disclosed herein.

Unless otherwise specified, the term "cold plate" or "liquid-cooled cold plate" refers to any conventional thermally conductive structure having one or more channels or passageways formed therein for flowing of liquid coolant therethrough. "Refrigerant evaporator" refers to the heat-absorbing mechanism or structure within a refrigeration loop. The refrigerant evaporator is alternatively referred to as a "sub-ambient evaporator" when temperature of the refrigerant passing through the refrigerant evaporator is below the temperature of ambient air entering the electronics rack. Within the refrigerant evaporator, heat is absorbed by evaporating the refrigerant of the refrigerant loop. "Condensate evaporator" refers to any condensate evaporation structure, which in one embodiment, may comprise one or more adjustable heaters for actively controlling an amount of evaporation, and thus an amount of humidification of egressing air. In addition, airflow through the electronics rack described herein comprises, in one example, ambient room air, which may be cooled via one or more computer room air-conditioning units, such as described below in connection with FIG. 1. This airflow through the electronics rack is an open path flow, drawing in room air into the electronics rack and expelling exhaust air from the electronics rack back into the room. Further, "data center" refers to a computer installation containing one or more electronics racks to be cooled. As a specific example, a data center may include one or more rows of rack-mounted computing units, such as server units.

One example of facility coolant disclosed below is water, and examples of coolant employed in the air-to-liquid heat exchanger of the dehumidifying cooling apparatus disclosed are water or a refrigerant. However, the concepts disclosed herein are readily adapted to use with other types of coolant. For example, one or more of the coolants may comprise a dielectric liquid, a fluorocarbon liquid, a Fluorinert™ liquid, a liquid metal, a brine, or other similar coolant, while still maintaining the advantages and unique features of the present invention. Thus, although the facility coolant is described herein below as water, and the heat exchanger coolant is described below as either water or a refrigerant, these are only examples.

Reference is made below to the drawings, which are not drawn to scale for ease of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered or screened doors at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air comprises in part exhausted air from the "hot" aisles of the computer installation defined by opposing air outlet sides 130 of the electronics racks 110.

In high performance server systems, it has become desirable to supplement air-cooling of selected high heat flux electronic components, such as the processor modules, within the electronics rack. For example, the System Z® server marketed by International Business Machines Corporation, of Armonk, N.Y., employs a vapor-compression refrigeration cooling system to facilitate cooling of the processor modules within the electronics rack. This refrigeration system employs R134a refrigerant as the coolant, which is supplied to a refrigerant evaporator coupled to one or more processor modules to be cooled. The refrigerant is provided by a modular refrigeration unit (MRU), which supplies the refrigerant at an appropriate temperature.

Figure 2B:
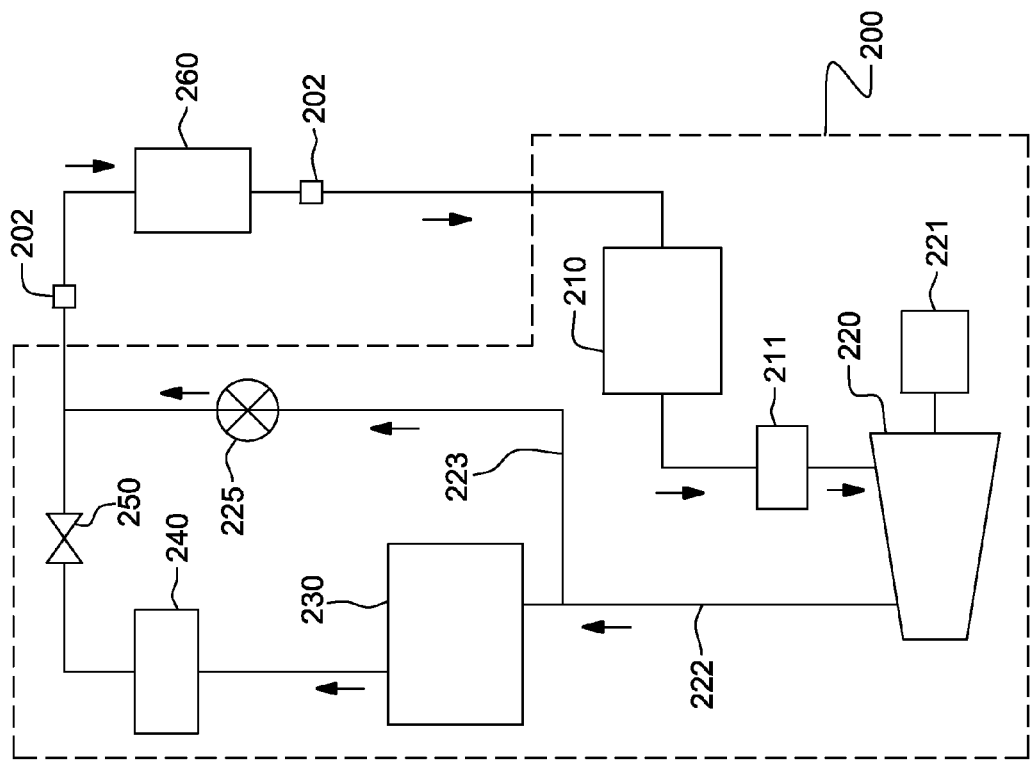
FIG. 2B is a schematic of one embodiment of a refrigerant loop for cooling an evaporator (or cold plate) coupled to a high heat flux electronic component (e.g., module) to be cooled, in accordance with an aspect of the present invention.
Figure 2A:
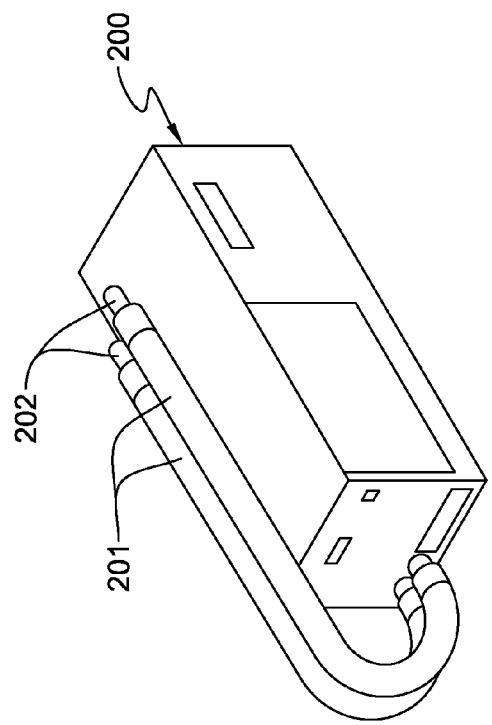
FIG. 2A is an isometric view of one embodiment of a modular refrigeration unit (MRU) and its quick disconnect connectors for attachment to a cold plate and/or evaporator disposed within an electronics rack to cool one or more electronic components (e.g., modules) thereof, in accordance with an aspect of the present invention.

FIG. 2A depicts one embodiment of a modular refrigeration unit 200, which may be employed within an electronic rack, in accordance with an aspect of the present invention. As illustrated, modular refrigeration unit 200 includes refrigerant supply and exhaust hoses 201 for coupling to a refrigerant evaporator or cold plate (not shown), as well as quick disconnect couplings 202, which respectively connect to corresponding quick disconnect couplings on either side of the refrigerant evaporator, that is coupled to the electronic component(s) or module(s) (e.g., server module(s)) to be cooled.

Further details of a modular refrigeration unit such as depicted in FIG. 2A are provided in commonly assigned U.S. Pat. No. 5,970,731.

FIG. 2B is a schematic of one embodiment of modular refrigeration unit 200 of FIG. 2A, coupled to a refrigerant evaporator (not shown) for cooling, for example, an electronic component within an electronic subsystem of an electronics rack. The electronic component may comprise, for example, a multichip module, a processor module, or any other high heat flux electronic component (not shown) within the electronics rack. As illustrated in FIG. 2B, a refrigerant evaporator 260 is shown that is coupled to the electronic component (not shown) to be cooled and is connected to modular refrigeration unit 200 via respective quick disconnect couplings 202. Within modular refrigeration unit 200, a motor 221 drives a compressor 220, which is connected to a condenser 230 by means of a supply line 222. Likewise, condenser 230 is connected to evaporator 260 by means of a supply line which passes through a filter/dryer 240, which functions to trap particulate matter present in the refrigerant stream and also to remove any water which may have become entrained in the refrigerant flow. Subsequent to filter/dryer 240, refrigerant flow passes through an expansion device 250. Expansion device 250 may be an expansion valve. However, it may also comprise a capillary tube or thermostatic valve. Thus, expanded and cooled refrigerant is supplied to evaporator 260. Subsequent to the refrigerant picking up heat from the electronic component coupled to evaporator 260, the refrigerant is returned via an accumulator 210 which operates to prevent liquid from entering compressor 220. Accumulator 210 is also aided in this function by the inclusion of a smaller capacity accumulator 211, which is included to provide an extra degree of protection against the entry of liquid-phase refrigerant into compressor 220. Subsequent to accumulator 210, vapor-phase refrigerant is returned to compressor 220, where the cycle repeats. In addition, the modular refrigeration unit is provided with a hot gas bypass valve 225 in a bypass line 223 selectively passing hot refrigerant gas from compressor 220 directly to evaporator 260. The hot gas bypass valve is controllable in response to the temperature of evaporator 260, which is provided by a module temperature sensor (not shown), such as a thermistor device affixed to the evaporator/cold plate in any convenient location. In one embodiment, the hot gas bypass valve is electronically controlled to shunt hot gas directly to the evaporator when temperature is already sufficiently low. In particular, under low temperature conditions, motor 221 runs at a lower speed in response to the reduced thermal load. At these lower speeds and loads, there is a risk of motor 221 stalling. Upon detection of such a condition, the hot gas bypass valve is opened in response to a signal supplied to it from a controller of the modular refrigeration unit.

In certain implementations, customer data centers may have ambient air humidity levels that are in violation of standard specifications for IT equipment, yielding room dew point temperature values that are sufficiently high to risk water condensation on surfaces within the electronics rack (such as refrigeration-cooled surfaces within the electronics rack) that are cooler than the dew point. In such cases, while coolant-carrying tubes transporting refrigerant (which may be at a sub-ambient temperature) may be insulated, one or more surfaces of the refrigerant evaporator (or the electronic component being cooled thereby) may possess surface temperatures that are below the dew point of the humid air passing through the server rack. If this condition persists for a sufficient length of time, there is a possibility of moisture from the air stream passing through the electronics rack condensing on the (sub-ambient) cooled surfaces, leading to the collection of water inside of the rack. This collected water could then fall on exposed electronic components due to gravity, or may be carried along due to the momentum of the airflow near the water collection surface(s). If the condensed water makes contact with exposed electronic devices, it could result in corrosion of electronic components, as well as in the short circuiting of electrical conductors.

Thus, disclosed herein is a dehumidifying and re-humidifying cooling apparatus comprising a heat exchanger assembly for, for example, a front door of an electronics rack hingedly mounted to an air inlet side of the rack, wherein ambient room air passes through the electronics rack from an air inlet side to an air outlet side thereof. The heat exchange assembly includes an air-to-liquid heat exchanger positioned for ingressing air to pass thereacross before passing through the rack, and the heat exchanger is in fluid communication with a coolant loop for passing coolant therethrough. The air-to-liquid heat exchanger with the coolant passing therethrough dehumidifies ingressing air to the rack to lower a dew point temperature of the air flowing through the rack. A condensate collector is disposed at the air inlet side of the rack, below the air-to-liquid heat exchanger, for collecting liquid condensate from the air-to-liquid heat exchanger's dehumidifying of ingressing air to the rack. Further, a condensate evaporator is disposed at the air outlet side of the rack which humidifies air egressing from the electronics rack. The condensate evaporator is coupled in fluid communication with the condensate collector at the air inlet side of the rack, and evaporates liquid condensate received from the condensate collector. By dehumidifying the air entering the electronics rack, the dehumidifying and re-humidifying cooling apparatus disclosed herein mitigates the risk of water condensate forming in the proximity of exposed electronic components by, for example, cooling one or more electronic components within the rack to a temperature below the dew point temperature of the ambient air of the data center. The dehumidifying and re-humidifying cooling apparatus disclosed herein may also be used with water-cooled electronics racks, which when exposed to data center environments with sufficiently high dew point temperatures, can run the risk of water condensation as well. By way of example, reference in this regard commonly assigned U.S. Pat. No. 7,450,385, which describes in detail an embodiment of a liquid-based cooling apparatus for an electronics rack, wherein the liquid may comprise water. Such a liquid-based cooling apparatus may contain several metallic water-carrying structures (tubes, cold plates, etc.) within the electronic subsystems, which potentially could be sites for water condensation should (for example) the humidity levels of ambient air being drawn through the electronics rack be in violation of predefined specifications for the rack.

FIGS. 3A & 3B depict one embodiment of an electronics rack 300 comprising an air inlet side 301 and an air outlet side 302, which respectively enable open flow ingress 305 and egress 306 of ambient room air through the electronics rack to facilitate cooling of electronic components within the rack. Electronics rack 300 includes a perforated front door 303 coupled to the air inlet side 301 of the electronics rack, and a perforated rear door 304 coupled to the air outlet side 302 of electronics rack 300. In one implementation, cool, humid ambient air 305 ingresses through perforated front door 303, and heated, humid exhaust air 306 egresses through perforated rear door 304.

FIG. 3B is a cross-sectional elevational view of electronics rack 300 of FIG. 3A, taken along line 3B-3B. By way of example, electronics rack 300 may comprise a System Z® electronics rack offered by International Business Machines Corporation, of Armonk, N.Y. Electronics rack 300 is shown to include one or more electronic subsystems 310, including processor modules to be cooled by sub-ambient evaporators 311. A modular refrigeration unit 200 is also provided, as well as power supplies 312 and miscellaneous components 313, such as input/output communication components 313. Perforated front door 303 is shown coupled to air inlet side 301 of electronics rack 300, and perforated rear door 304 is coupled to air outlet side 302 of electronics rack 300, wherein cool, humid ambient air 305 ingresses through perforated front door 303, passing across the electronic components within the electronics rack, and egresses as hot exhaust air 306. As illustrated, modular refrigeration unit 200 is in fluid communication with the sub-ambient or refrigerant evaporators coupled to the processor modules to be cooled 311, via a refrigerant loop 315.

In this example, it is assumed that the ambient air entering the electronics rack is humid, and is to be dehumidified, to facilitate the sub-ambient cooling of the high heat flux electronic components coupled to the evaporators. The dehumidifying and re-humidifying cooling apparatus disclosed herein includes, in part, an air-to-liquid heat exchanger 320 disposed at air inlet side 301 of electronics rack 300, for example, within perforated front door 303, as well as a condensate collector 330 disposed to collect liquid condensate from the air-to-liquid heat exchanger's dehumidifying of the ingressing ambient air, and a condensate evaporator 335 disposed at air outlet side 302 of electronics rack 300, for example, in perforated rear door 304, for humidifying exhaust air egressing from the electronics rack. Condensate evaporator 335 is shown coupled in fluid communication with condensate collector 330 via a line 331 configured to feed (e.g., via gravity) liquid condensate from condensate collector 330 to condensate evaporator 335. Liquid condensate delivered to condensate evaporator 335 may be heated, for example, via one or more adjustable water heaters 336 to evaporate the liquid condensate 337 into the exhaust air egressing from the air outlet side 302 of electronics rack 300.

In this embodiment, air-to-liquid heat exchanger 320 may comprise an air-to-water heat exchanger, wherein water is fed through the heat exchanger via a coolant loop 325. The water within coolant loop 325 is cooled via a liquid-to-liquid heat exchanger 326 in fluid communication with both refrigerant loop 315 and coolant loop 325. That is, refrigerant exiting modular refrigeration unit 200 passes through liquid-to-liquid heat exchanger 326 and cools the coolant within coolant loop 325 before passing through the sub-ambient evaporators 311. Coolant (e.g., water) is pumped 327 through coolant loop 325, including through air-to-liquid heat exchanger 320.

To facilitate operation of the dehumidifying and re-humidifying cooling apparatus disclosed herein, a controller 340 is provided coupled via data cables 345 to a plurality of rack inlet temperature and relative humidity sensors 341, as well as to a plurality of server inlet temperature and relative humidity sensors 342, and coolant temperature sensors 344 disposed in the coolant supply line and coolant return line of coolant loop 325 coupled to air-to-liquid heat exchanger 320. In addition, controller 340 is coupled, in one embodiment, to pump 327 for automatically controlling the ON/OFF state of pump 327, as well as the speed of the pump, and to heater(s) 336 disposed within condensate evaporator 335 for automatically controlling the rate of evaporation of liquid condensate from the condensate evaporator.

Figure 3C:
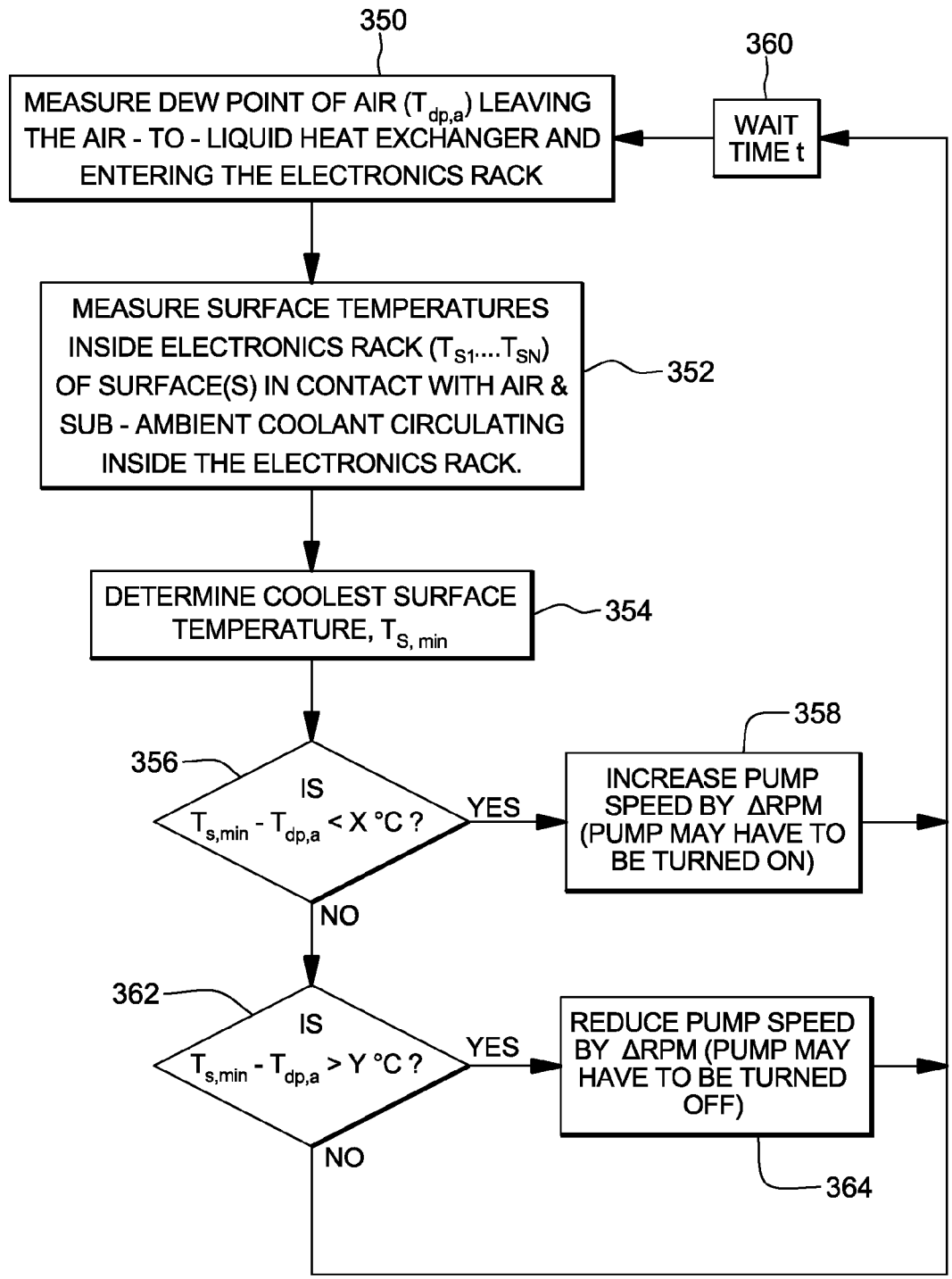
FIG. 3C depicts one embodiment of a control process for controlling the dehumidifying of ingressing air to the electronics rack, in accordance with an aspect of the present invention.

FIG. 3C illustrates one example of processing implemented by controller 340 for controlling dehumidifying of the ingressing ambient air passing across the air-to-liquid heat exchanger 320 of the dehumidifying and re-humidifying cooling apparatus of FIGS. 3A & 3B. In this example, coolant flowing through the air-to-liquid heat exchanger is assumed to be water, and liquid-to-liquid heat exchanger 326 (FIG. 3B) is a water-to-refrigerant heat exchanger. Control of the water flow rate through coolant loop 325 (FIG. 3B) can result in a higher or lower water temperature exiting the water-to-refrigerant heat exchanger and entering the air-to-liquid heat exchanger. A higher water flow rate resulting from a higher pump motor speed yields a lower water temperature exiting the liquid-to-liquid heat exchanger, and vice versa. Alternatively, a bypass valve (not shown) could be used in automatically controlling the coolant temperature entering the air-to-liquid heat exchanger, whether the coolant is water, a refrigerant, or other coolant. There can still be other approaches to controlling the coolant temperature entering the air-to-liquid heat exchanger. For example, the flow rate and temperature of refrigerant coolant on the cold side of the liquid-to-liquid heat exchanger could be manipulated.

In the process of FIG. 3C, the coolant temperature control is based on an extent of dehumidification deemed necessary based on a sensed dew point temperature of the ambient air entering the electronics rack (e.g., the servers within the rack), that is, the sensed dew point temperature of dehumidified air exiting the air-to-liquid heat exchanger ($T_{dp,a}$) as well as a coolest measured surface temperature ($T_{s1}, T_{s2} \ldots T_{sN}$) of various cool surfaces monitored within the rack that will contact air passing through the electronics rack. The location of the cool surface temperature sensors can be determined a priori, based on lab testing of the particular electronics rack implementation. The cool surface temperatures could be sensed at various parts of the rack's interior; for example, on the tubing or the hoses that distribute sub-ambient coolant, or on the cold plates or evaporators that cool the processor modules. The coolest surface is denoted as $T_{s,\ min}$ in FIG. 3C. Note that, in this discussion, dehumidifying of ambient air passing across the air-to-liquid heat exchanger may depend on the sensed dew point temperature of the ambient air passing across the air-to-liquid heat exchanger. For example, if the dew point is sufficiently low, e.g., the humidity of the ambient air is within specification for the electronics rack, then no dehumidification may be needed. Thus, the dehumidifying and humidifying cooling apparatus disclosed herein may be selectively activated and deactivated by the controller as needed, dependent on ambient air conditions.

Referring to the flowchart of FIG. 3C, the controller 340 (FIG. 3B) determines the dew point of the air leaving the dehumidifying air-to-liquid heat exchanger 320 (FIG. 3B) and entering the air inlet side of the electronics rack 350, as well as determines the monitored surface temperatures inside the electronics rack ($T_{s1} \ldots T_{sN}$) of surfaces in contact with air and sub-ambient coolant circulating inside the electronics rack 352. The controller then determines the coolest surface temperature $T_{s,\ min}$ 354. After these temperatures ($T_{dp,a}$ and $T_{s,\ min}$) are sensed or determined, the difference in temperature between the coolest surface temperature $T_{s,\ min}$ and the dew point temperature $T_{dp,a}$ is determined and the controller compares this difference with a first predetermined threshold value X° C. 356. If the difference is lower than the first predefined threshold X° C., then it means that the dew point of the air entering the server is close to a value when condensation might begin to occur. In such a case, the pump flow rate is increased (or if the pump is OFF, the pump is switched ON) 358 so as to increase (or start) dehumidifying of the air passing across the dehumidifying air-to-liquid heat exchanger, thus yielding a lower value for $T_{dp,a}$. In the case where the difference between $T_{s,\ min}$ and $T_{dp,a}$ is very large, that is greater than a second threshold value Y° C. (where X<Y) 362, then the air is deemed to be unnecessarily dry, and the pump flow rate can be ramped down (or the pump switched OFF) 364 to reduce the extent of dehumidification, thus yielding a higher $T_{dp,a}$. After waiting a defined time interval t 360, the processing determines a new dew point temperature for the air leaving the dehumidifying air-to-liquid heat exchanger ($T_{dp,a}$) and new surface temperatures inside the electronics rack ($T_{s1} \ldots T_{sN}$) to identify a new coolest surface temperature $T_{s,\ min}$.

The preceding processing describes a method for controlling dehumidifying based on sensed air dew point temperature and sensed cool surface temperatures within the electronics rack. Alternative to this approach, the temperature of the cool surfaces could be reduced by a reduction in coolant temperature being applied within the electronics rack such that no condensation would occur within the rack, while still providing for greater cooling capability through the reduction of coolant temperature. In such a case, the dehumidifying air-to-liquid heat exchanger can be operated for maximum dehumidification in conjunction with a provision for coolest possible coolant being circulated through the liquid-cooled cold plates or evaporators within the electronics rack coupled to the one or more electronic components to be cooled. In cases (described below) where the coolant flowing through the dehumidifying air-to-liquid heat exchanger is in series flow with the coolant flowing through the liquid-cooled cold plates or evaporators, there is an intrinsic overall system attribute which would reduce the likelihood of condensation within the electronics rack. This is because any likely condensation that may occur based on coolant temperature and ambient dew point temperature would likely occur at the dehumidifying air-to-liquid heat exchanger, and not inside the electronics rack.

Figure 3D:
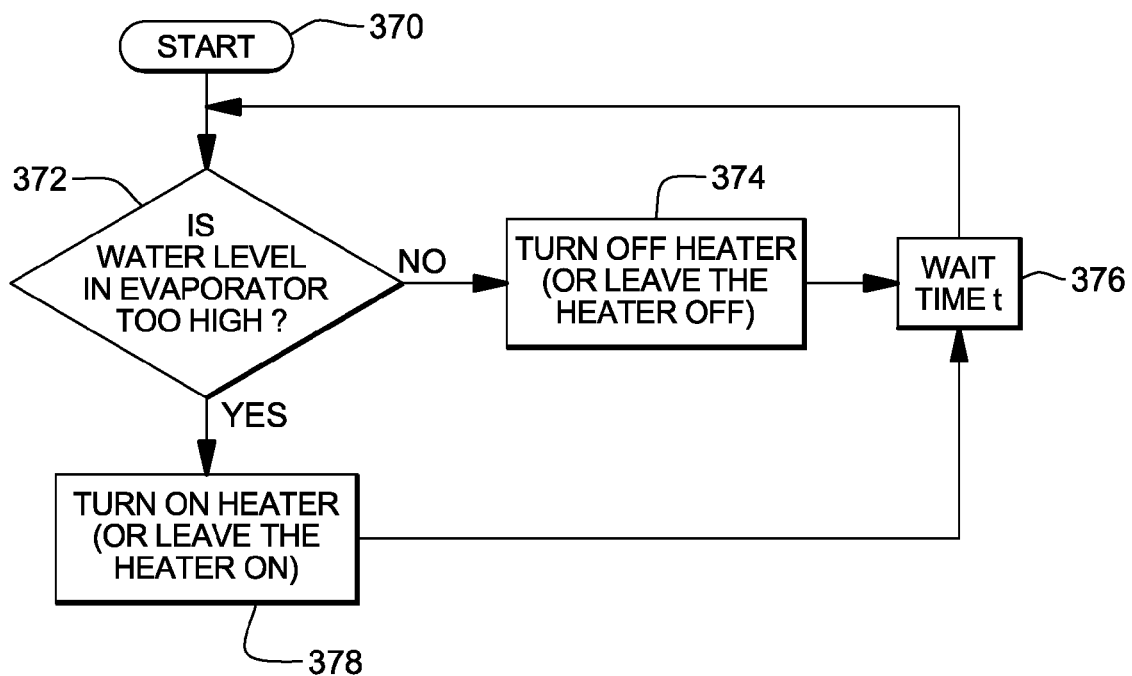
FIG. 3D depicts one embodiment of a control process for controlling evaporation of liquid condensate from the condensate evaporator at the air outlet side of the electronics rack, in accordance with an aspect of the present invention.

FIG. 3D depicts one implementation of a control process, which may also be implemented by controller 340 (FIG. 3B), for controlling operation of one or more heaters associated with the condensate evaporator for controlling a rate of liquid condensate evaporation into the exhaust air exiting the air outlet side of the electronics rack. The process starts 370 with the controller determining whether the water level within the condensate evaporator 335 (FIG. 3B) is too high 372. If "no", then the heater is turned OFF (or the heater is left OFF) 374, after which the controller waits a time interval t 376 before repeating the process. If the water level within the evaporator is determined to be too high, that is, is above a defined water level threshold, then the controller turns the heater ON, or if the heater is adjustable, increases the amount of heat being applied to the condensate evaporator to increase the rate of evaporation 378, after which the controller waits time interval t 376 before repeating the process.

In operation, the surfaces of air-to-liquid heat exchanger 320 (FIG. 3B) function as surfaces for condensation of excess moisture present in humid ingressing ambient air. Air-to-liquid heat exchanger 320 is configured and mounted so that ingressing ambient air into the electronics rack necessarily passes across the air-to-liquid heat exchanger before passing through the electronics rack. In this manner, the exposed surfaces of the air-to-liquid heat exchanger condense water from the humid ingressing ambient air, and the condensed water drains from the surfaces of the heat exchanger to the bottom of the heat exchanger into condensate collector 330. This condensate is then extracted from condensate collector using, in one embodiment, a gravity drain line which transports the liquid condensate to the condensate evaporator located at the air outlet side of the electronics rack. At the evaporator, the liquid condensate is evaporated so that the humid ambient air entering the rack is dehumidified at the air inlet side of the rack, and then the dehumidified exhaust air exiting the electronics rack is re-humidified using the liquid condensate collected at the air inlet side thereof. The heat absorbed by the coolant (e.g., water) from the ingressing ambient air stream is both latent and sensible heat transfer, and (in the embodiment of FIG. 3B) this heat is rejected to the refrigerant flowing through the modular refrigeration unit via the liquid-to-liquid heat exchanger.

In the dehumidifying and re-humidifying cooling apparatus of FIG. 3B, quick disconnect couplings (not shown) can be employed in conjunction with hoses and barb fittings to plumb the air-to-liquid heat exchanger to the pump and liquid-to-liquid heat exchanger in a manner which facilitates easy assembly and disassembly, while still allowing the perforated front door to be opened and closed while the air-to-liquid heat exchanger is operational. The temperature and humidity sensors placed on both sides of the air-to-liquid heat exchanger provide real-time data to determine whether dehumidification is required, and if so, the temperature at which the chilled coolant should be provided, for example, by manipulating the pump speed. If dehumidification is not required, then the coolant loop's pump could be shut off. Similarly, heaters within the condensate evaporator could be powered to varying levels, depending on the water evaporation rate desired under the prevalent ambient conditions. For example, the condensate evaporator can be powered so that there is a constant condensate liquid in the evaporator so that whatever water is being condensed is also being subsequently evaporated. All surfaces exposed to the water condensate can be chemically treated to inhibit growth of biological or chemical matter.

Figure 4:
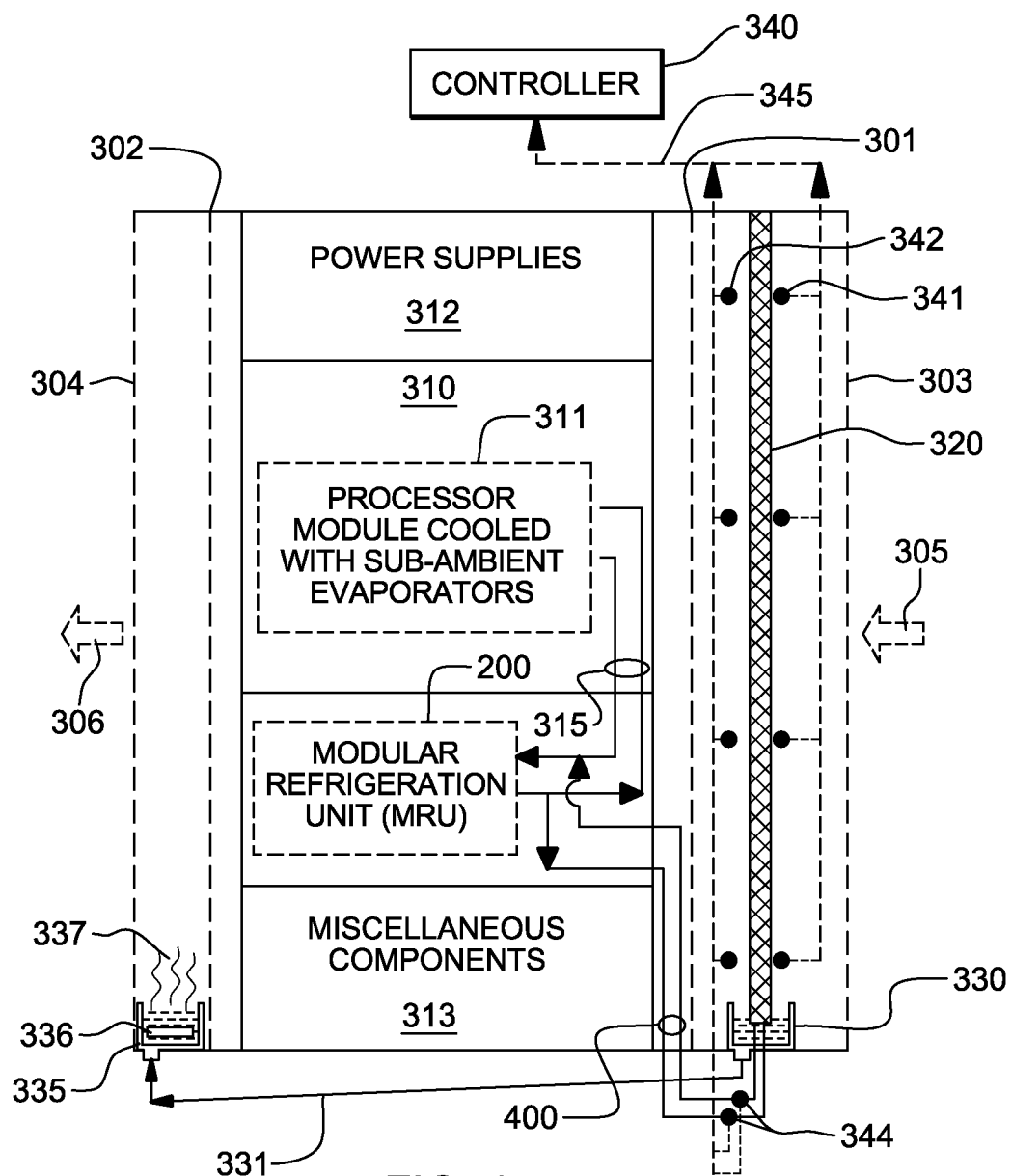
FIG. 4 is a cross-sectional elevational view of another embodiment of an electronics rack and a dehumidifying and re-humidifying cooling apparatus, in accordance with an aspect of the present invention.

FIG. 4 depicts an alternate embodiment of a dehumidifying and re-humidifying cooling apparatus, in accordance with an aspect of the present invention. This dehumidifying and re-humidifying cooling apparatus is identical to that described above in connection with FIG. 3B, with the exception that a coolant loop 400 is shown in fluid communication with the refrigerant loop 315 coupling modular refrigeration unit 200 to the sub-ambient evaporators coupled to the processor modules being liquid-cooled 311. Thus, in this embodiment, a portion of the chilled refrigerant from modular refrigeration unit 200 is routed directly through the air-to-liquid heat exchanger 320, and there is no external pump from the modular refrigeration unit required (or liquid-to-liquid heat exchanger required), with the modular refrigeration unit compressor and modular refrigeration unit heat exchanger being sized appropriately to allow for flow of refrigerant through the air-to-liquid heat exchanger 320. The remaining components of the dehumidifying and re-humidifying cooling apparatus depicted in FIG. 4 are similar to the corresponding labeled components described above in connection with FIG. 3B. In this implementation, liquid temperature sensors 344 are sensing temperature of the refrigerant flowing through coolant loop 400, rather than, for example, water, as in the case of the embodiment of FIG. 3B.

Figure 5:
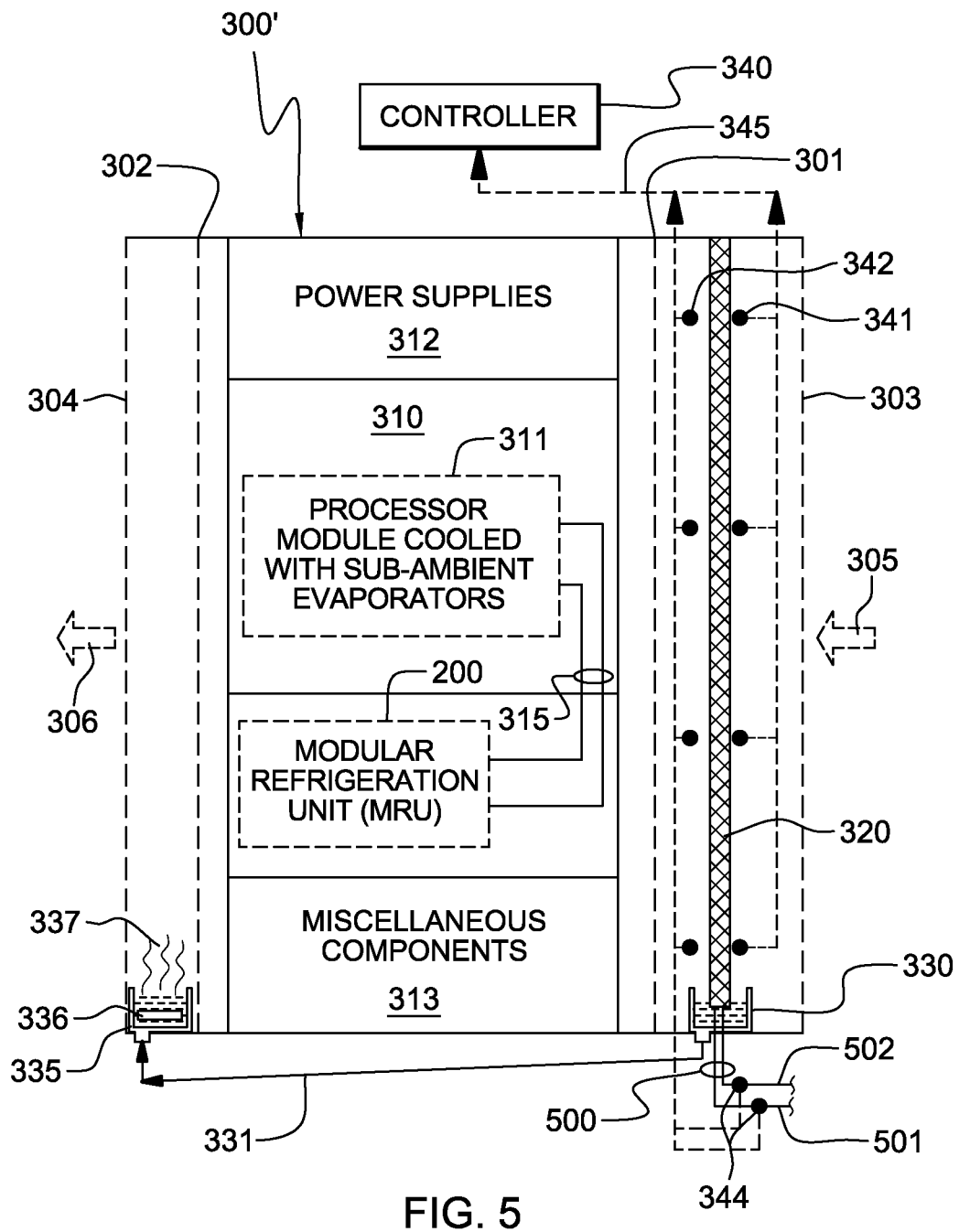
FIG. 5 is a cross-sectional elevational view of still another embodiment of an electronics rack and a dehumidifying and re-humidifying cooling apparatus, in accordance with an aspect of the present invention.
Figure 6:
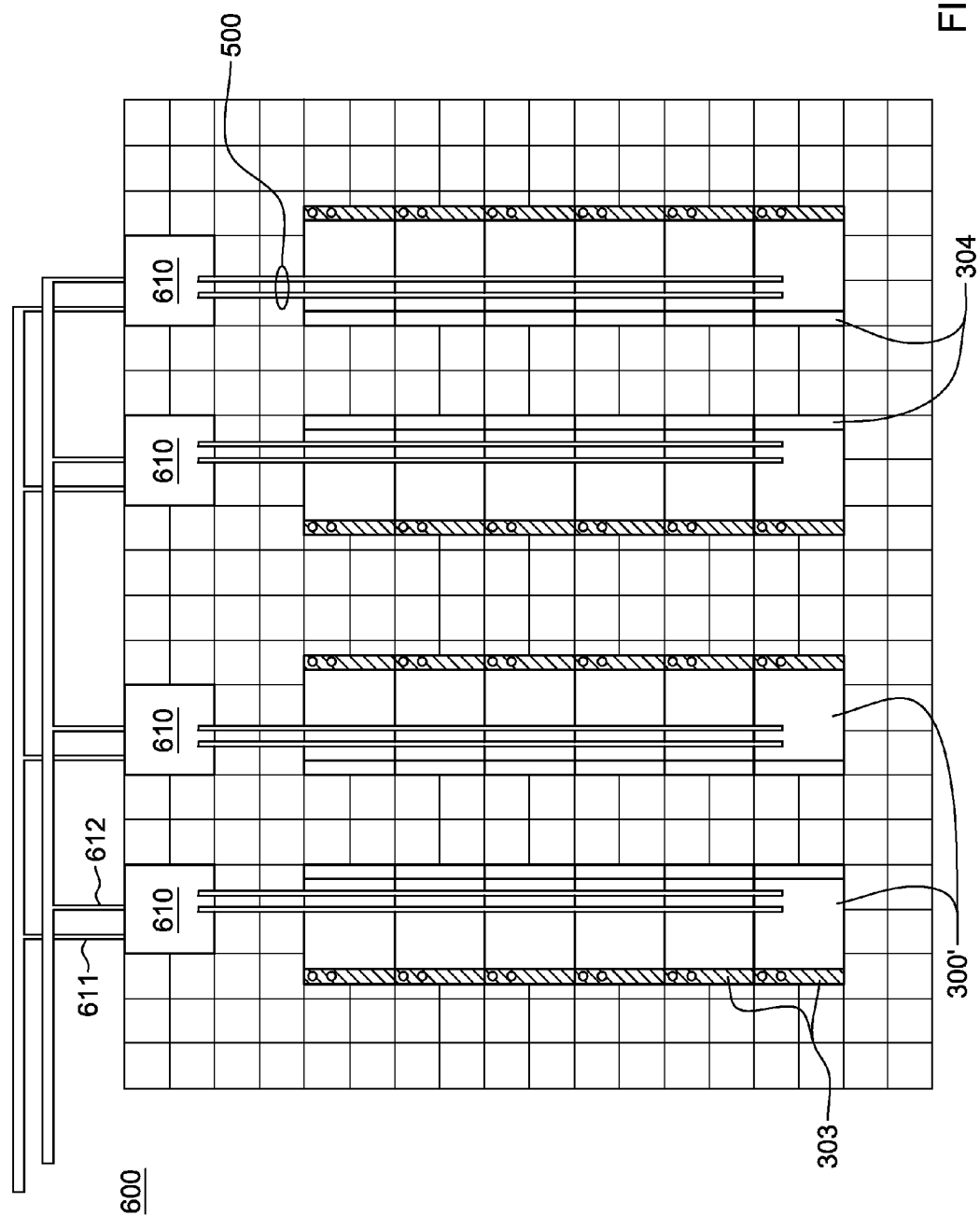
FIG. 6 is a top plan view of one embodiment of a data center comprising multiple coolant distribution units and a plurality of electronics racks with dehumidifying and re-humidifying cooling apparatuses such as depicted in FIG. 5, in accordance with an aspect of the present invention.
Figure 7:
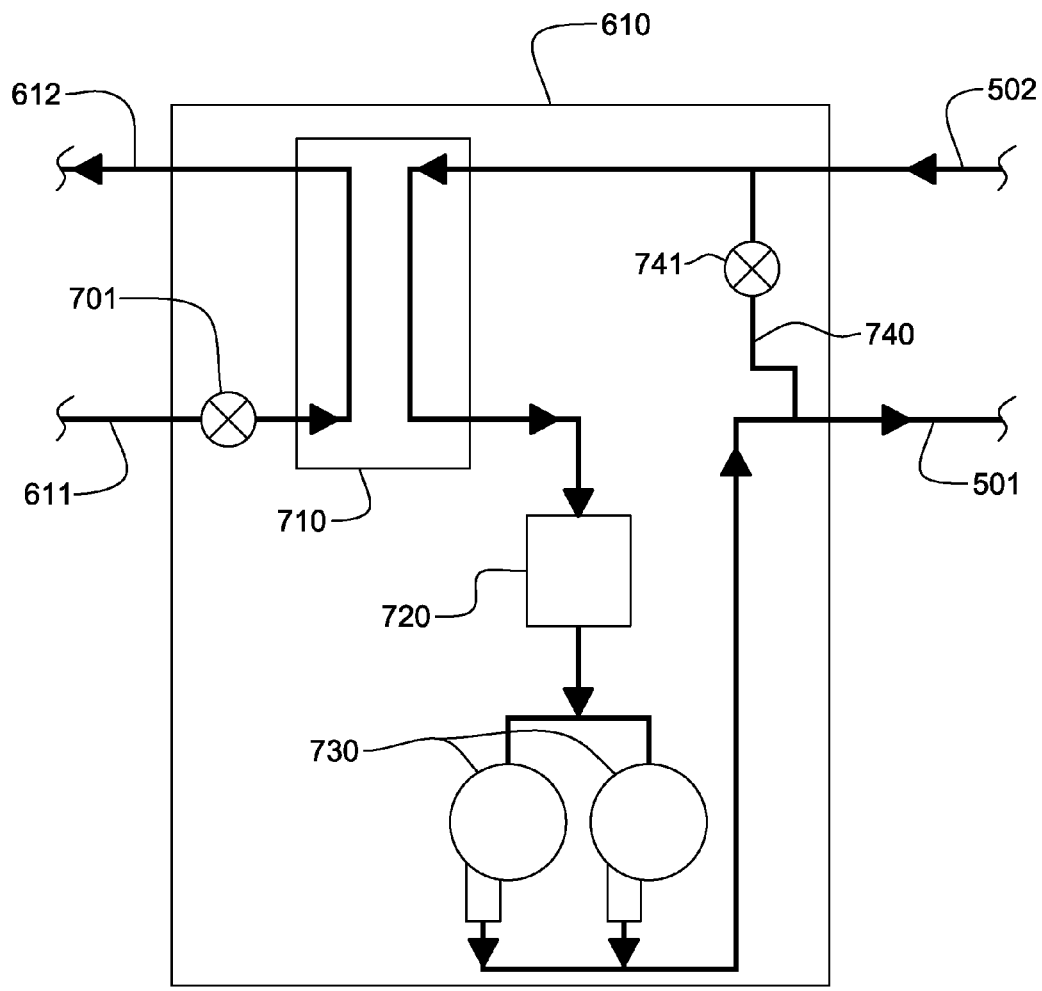
FIG. 7 is a schematic of one embodiment of a coolant distribution unit illustrated in the data center of FIG. 6, in accordance with an aspect of the present invention.

FIGS. 5-7 depict an alternate implementation of a dehumidifying and re-humidifying cooling apparatus for an electronics rack 300', in accordance with an aspect of the present invention. Unless otherwise started, this dehumidifying and re-humidifying cooling apparatus is identical to that described in connection with FIG. 3B. Referring first to FIG. 5, one or more coolant distribution units within the data center are employed to provide chilled coolant via a coolant loop 500 (comprising a coolant supply line 501 and a coolant return line 502) coupling a respective coolant distribution unit and air-to-liquid heat exchanger 320 in fluid communication.

Further, by way of example, modular refrigeration unit (MRU) 200 is depicted within electronics rack 300' coupled via a refrigerant loop 315 to sub-ambient evaporators coupled to one or more processor modules to be cooled 311. Alternatively, water-based cooling could be employed with the electronics rack in combination with the dehumidifying and re-humidifying cooling apparatus depicted in FIGS. 5-7.

FIGS. 6 & 7 depict embodiments of a data center and coolant distribution unit, respectively, which may be employed with a dehumidifying and re-humidifying cooling apparatus such as depicted in FIG. 5.

FIG. 6 depicts one embodiment of a data center, generally denoted 600, employing cooled electronics systems, in accordance with an aspect of the present invention. Data center 600 includes a plurality of rows of electronics racks 300', each of which includes a perforated front door 303 and perforated rear door 304, such as described above in connection with the embodiment of FIGS. 3A & 3B. Each perforated front door 303 supports an air-to-liquid heat exchanger of a dehumidifying and re-humidifying cooling apparatus such as described above in connection with FIG. 5. Each perforated rear door 304 includes a condensate evaporator for re-humidifying the exhaust air egressing from the electronics rack. Multiple coolant distribution units 610, referred to hereinbelow as pumping units, are disposed within the data center (along with one or more air-conditioning units (not shown)). In this embodiment, each pumping unit forms a coolant distribution subsystem with one row of a plurality of electronics racks. Each pumping unit includes a liquid-to-liquid heat exchanger where heat is transferred from a coolant loop to a facility coolant loop. Chilled facility coolant, such as water, is received via a facility coolant supply line 611, and is returned via a facility coolant return line 612. Coolant, such as water, is provided via a coolant supply loop 500 (comprising the illustrated coolant supply and return lines). In one embodiment, coolant supply and return lines of the coolant loop are hard-plumbed within the data center, and preconfigured to align under and include branch lines extending towards the electronics racks of the respective row of electronics racks.

FIG. 7 depicts one embodiment of a coolant distribution unit 610 for the data center 600 of FIG. 6. Liquid-to-liquid heat exchanger 710 cools coolant passing through the coolant loop comprising coolant supply line 501 and coolant return line 502. (In one embodiment, the coolant has undergone heating within the respective air-to-liquid heat exchangers disposed within the perforated front doors of the electronics racks.) The facility coolant loop of liquid-to-liquid heat exchanger 710 comprises facility coolant supply line 611 and facility coolant return line 612, which in one embodiment, provide chilled facility water to the liquid-to-liquid heat exchanger. A control valve 701 may be employed in facility coolant supply line 611 to control facility coolant flow rate through the liquid-to-liquid heat exchanger 710. After the coolant is cooled within liquid-to-liquid heat exchanger 710, the coolant is collected in a reservoir 720 for pumping via a redundant pump assembly 730 back to the respective row of electronics racks via coolant supply line 501. As shown in FIG. 7, a bypass line 740 with a bypass valve 741 may be employed to control the amount of coolant fed back through the coolant supply line, and hence, control temperature of coolant delivered to the respective dehumidifying air-to-liquid heat exchangers mounted to the doors of the electronics racks.

Figure 8:
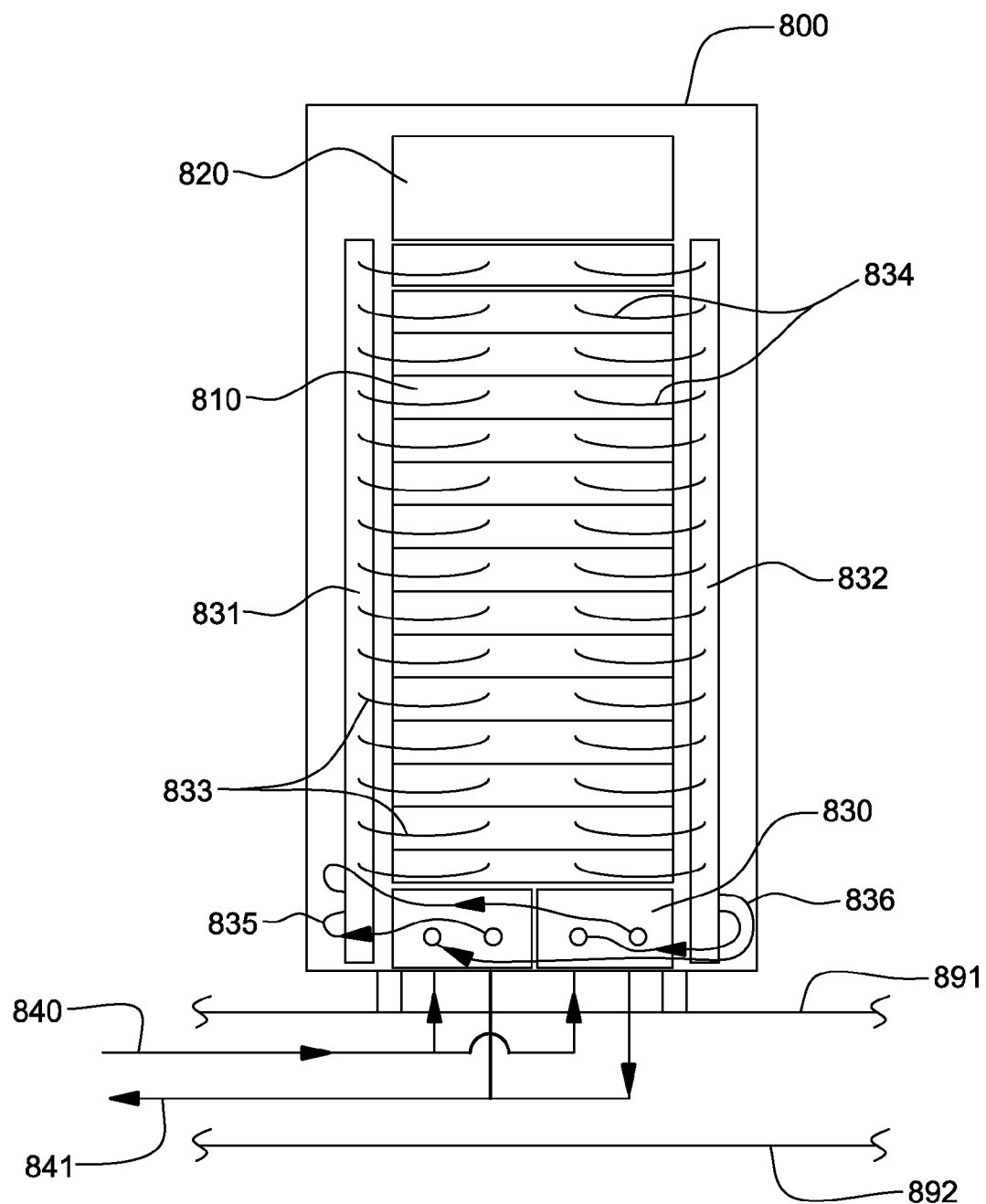
FIG. 8 is an elevational view of one embodiment of a liquid-cooled electronics rack comprising multiple liquid-cooled electronics subsystems to be cooled, in accordance with an aspect of the present invention.
Figure 9:
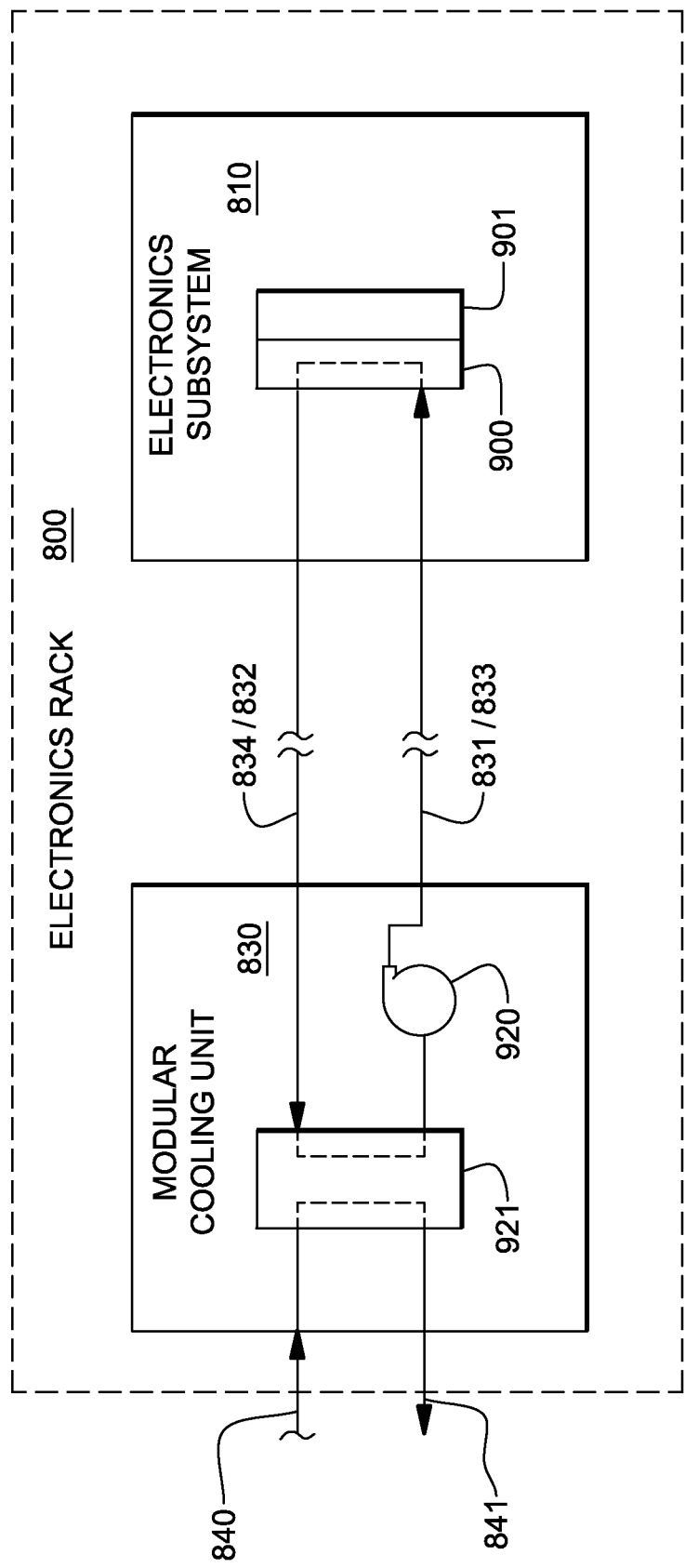
FIG. 9 is a partial schematic of the liquid-cooled electronics rack of FIG. 8, wherein an electronic component (e.g., module) is liquid-cooled by system coolant provided by one or more modular cooling units disposed within the electronics rack, in accordance with an aspect of the present invention.
Figure 10:
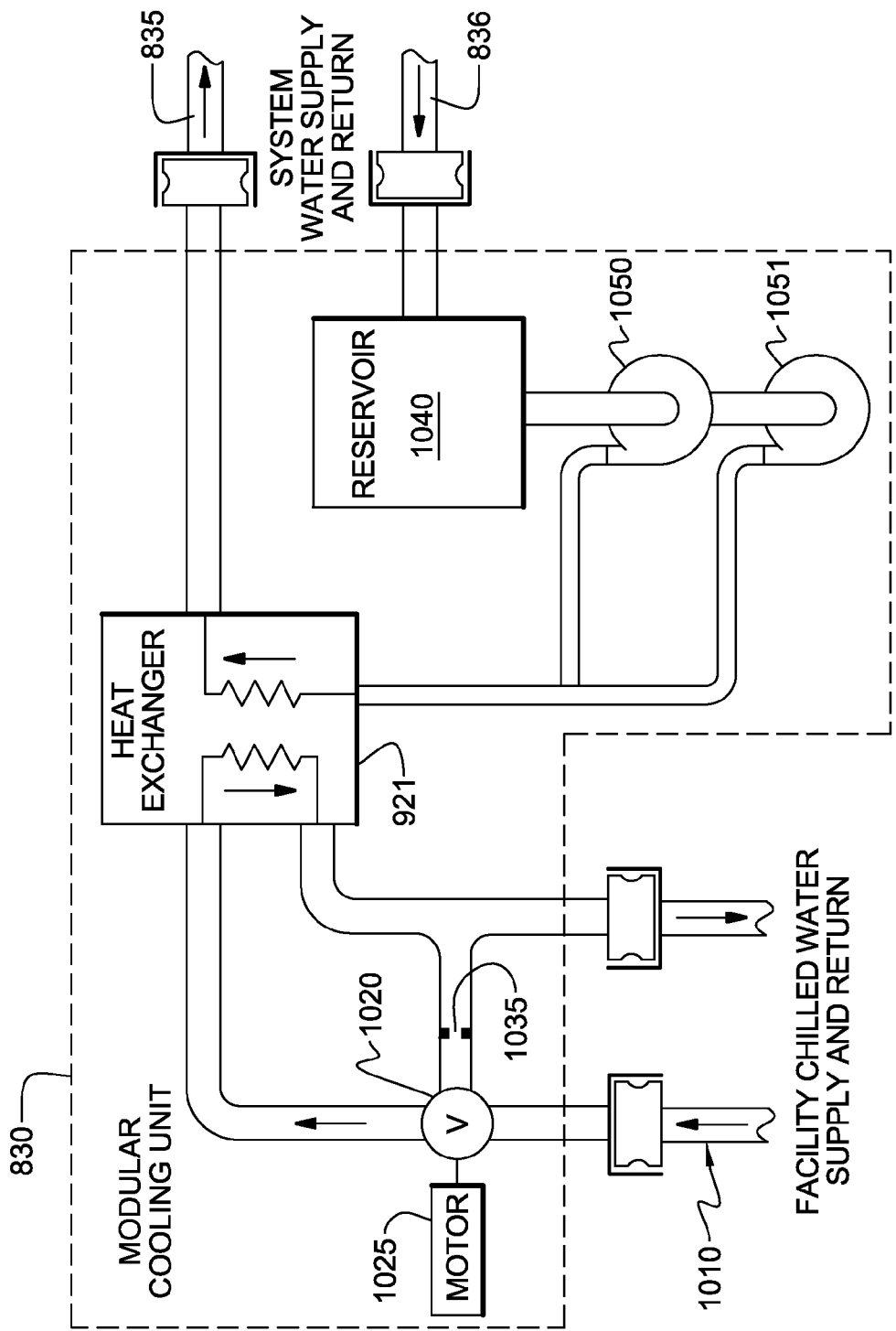
FIG. 10 is a schematic of one embodiment of a modular cooling unit for the liquid-cooled electronics rack of FIGS. 8 & 9, in accordance with one aspect of the present invention.
Figure 11:
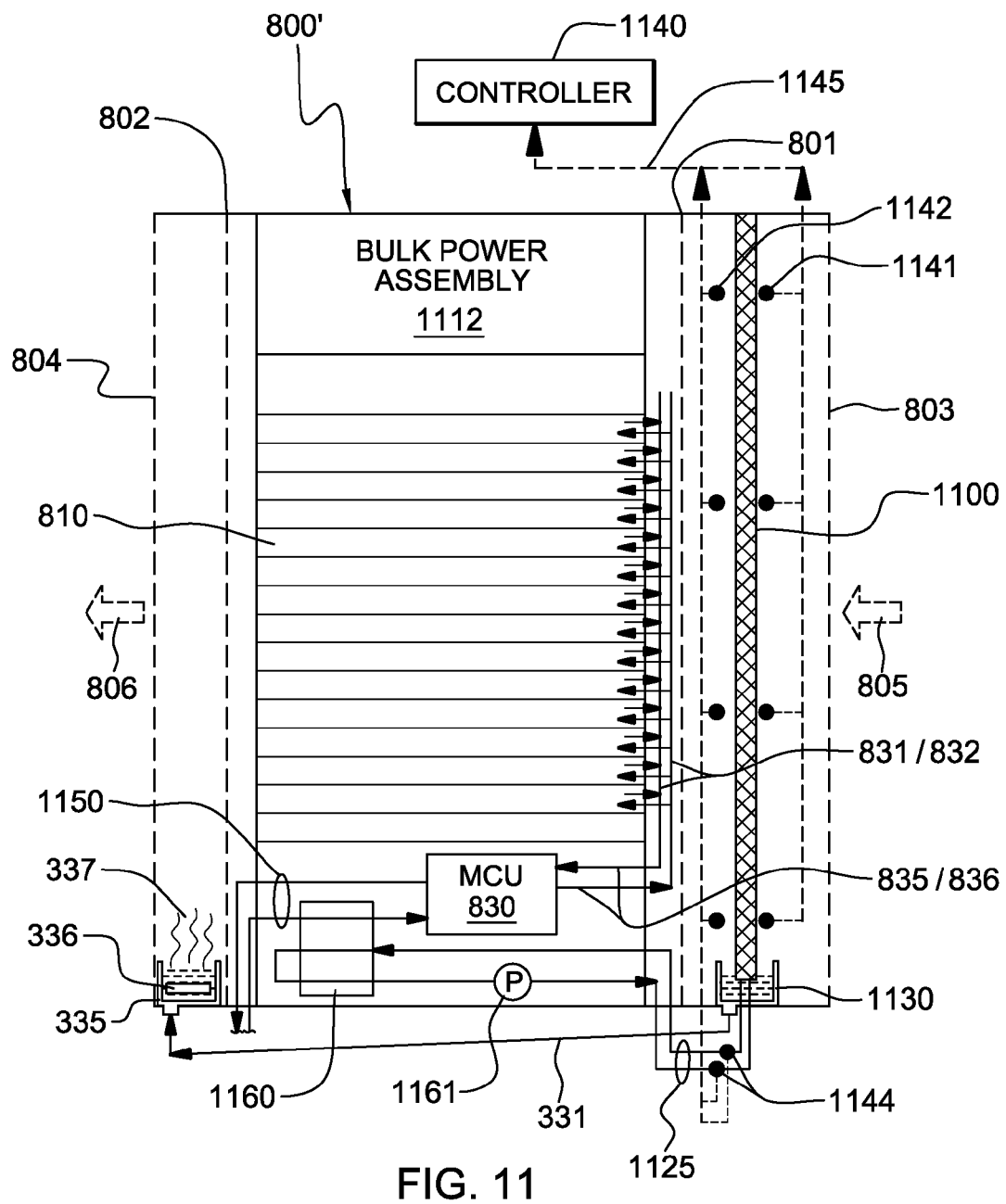
FIG. 11 is a cross-sectional elevational view of one embodiment of a liquid-cooled electronics rack such as depicted in FIGS. 8-10, and a dehumidifying and re-humidifying cooling apparatus therefor, in accordance with an aspect of the present invention.
Figure 12:
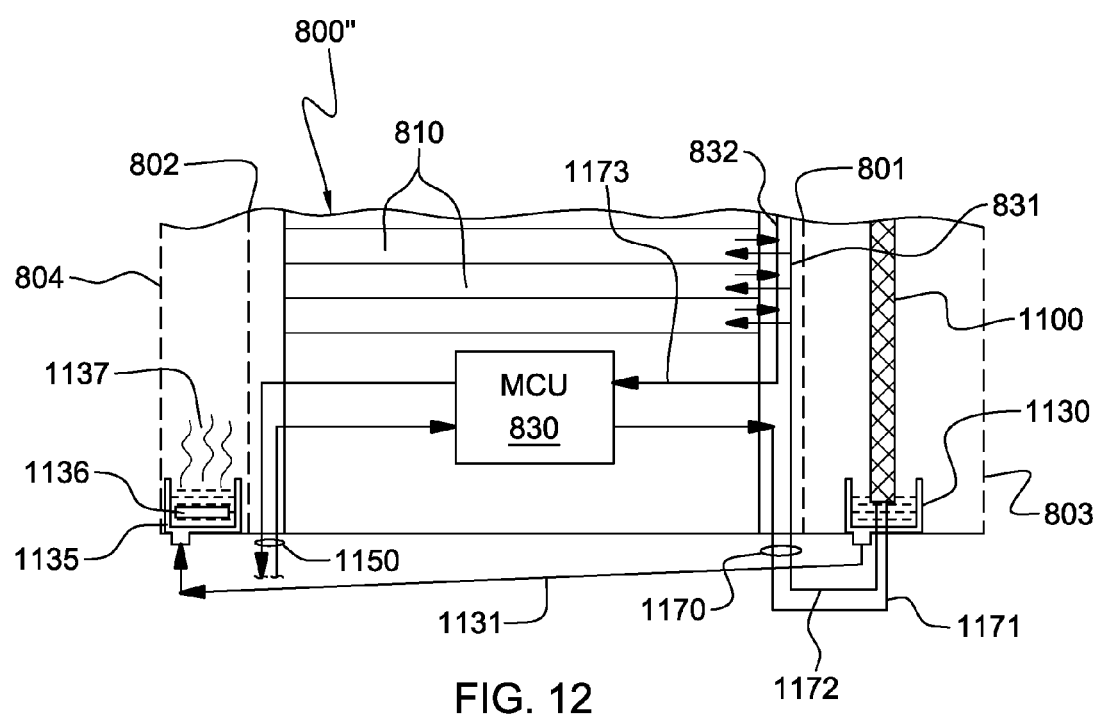
FIG. 12 is a partial cross-sectional elevational view of an alternate embodiment of a liquid-cooled electronics rack such as depicted in FIGS. 8-10, and a dehumidifying and re-humidifying cooling apparatus therefor, in accordance with an aspect of the present invention.

FIGS. 8-10 depict one embodiment of a liquid-cooled electronics rack comprising multiple liquid-cooled electronic subsystems. The dehumidifying and re-humidifying cooling apparatus disclosed herein may also be employed in connection with such a liquid-cooled electronics rack. Embodiments of the resultant cooled electronic system are depicted in FIGS. 11 & 12, which are described below.

FIG. 8 depicts one embodiment of a liquid-cooled electronics rack 800. As illustrated, liquid-cooled electronics rack 800 comprises a plurality of electronics subsystems 810, which may be processor or server nodes. A bulk power regulator 820 is shown disposed at an upper portion of liquid-cooled electronics rack 800, and two modular cooling units (MCUs) 830 are disposed in a lower portion of the liquid-cooled electronics rack. In the embodiments described herein, the coolant is assumed to be water or an aqueous-based solution (by way of example only).

In addition to MCUs 830, the cooling system includes a system water supply manifold 831, a system water return manifold 832, and manifold-to-node fluid connect hoses 833 coupling system water supply manifold 831 to electronics subsystems 810, and node-to-manifold fluid connect hoses 834 coupling the individual electronics subsystems 810 to system water return manifold 832. Each MCU 830 is in fluid communication with system water supply manifold 831 via a respective system water supply hose 835, and each MCU 830 is in fluid communication with system water return manifold 832 via a respective system water return hose 836.

As illustrated, the heat load of the electronics subsystems is transferred from the system water to cooler facility water supplied by facility water supply line 840 and facility water return line 841 disposed, in the illustrated embodiment, in the space between a raised floor 891 and a base floor 892.

FIG. 9 schematically illustrates operation of the cooling system of FIG. 8, wherein a liquid-cooled cold plate 900 is shown coupled to an electronics module 901 of an electronics subsystem 810 within the liquid-cooled electronics rack 800. Heat is removed from electronics module 901 via the system coolant circulated via pump 920 through cold plate 900 within the system coolant loop defined by liquid-to-liquid heat exchanger 921 of modular cooling unit 830, lines 831/833, 834/832 and cold plate 900. The system coolant loop and modular cooling unit are designed to provide coolant of a controlled temperature and pressure, as well as controlled chemistry and cleanliness, to facilitate cooling of the electronics module(s). Furthermore, the system coolant is physically separate from the less controlled facility coolant in lines 840, 841, to which heat is ultimately transferred.

FIG. 10 depicts a more detailed embodiment of a modular cooling unit 830. As shown in FIG. 10, modular cooling unit 830 includes a first cooling loop wherein building chilled, facility coolant is supplied 1010 and passes through a control valve 1020 driven by a motor 1025. Valve 1020 determines an amount of facility coolant to be passed through liquid-to-liquid heat exchanger 921, with a portion of the facility coolant possibly being returned directly via a bypass orifice 1035. The modular cooling unit further includes a second cooling loop with a reservoir tank 1040 from which system coolant is pumped, either by pump 1050 or pump 1051, into the liquid-to-liquid heat exchanger 921 for conditioning and output thereof, as cooled system coolant to the subsystems of the electronics rack to be cooled. The cooled system coolant flows to and from the system water supply manifold and system water return manifold, respectively, of the liquid-cooled electronics rack via the system water supply hose 835 and system water return hose 836.

As noted, FIGS. 11 & 12 depict one embodiment of a liquid-cooled electronics rack, such as described above in connection with FIGS. 8-10, in combination with a dehumidifying and re-humidifying cooling apparatus, such as disclosed herein.

In FIG. 11, a liquid-cooled electronics rack 800' is illustrated comprising a plurality of electronic subsystems 810, which may be processor or server nodes. Ambient air 805 ingresses via an air inlet side 801 of electronics rack 800' through a perforated front door 803, and exhaust air 806 exiting from an air outlet side 802 of electronics rack 800' egresses via a perforated rear door 804. Electronic subsystems 810 are liquid-cooled via one or more modular cooling units 830 which provide a first cooled system coolant thereto via coolant supply and return lines 835, 836 coupling modular cooling unit 830 to coolant inlet and return manifolds 831, 832, respectively. Respective manifold-to-node fluid connect hoses couple the coolant inlet and return manifolds to the respective electronic subsystems 810. A facility coolant loop 1150 provides facility coolant to the liquid-to-liquid heat exchanger within modular cooling unit 830.

In this implementation, the dehumidifying and re-humidifying cooling apparatus includes a dehumidifying air-to-liquid heat exchanger 1100 cooled via a second system coolant flowing through a system coolant loop 1125. This second system coolant within system coolant loop 1125 is cooled via an auxiliary liquid-to-liquid heat exchanger 1160, through which, in this example, the chilled facility coolant passes before being supplied to modular cooling unit 830. An auxiliary pump 1161 pumps coolant through system coolant loop 1125 to cool the surfaces of the dehumidifying air-to-liquid heat exchanger to a sub-ambient temperature to facilitate formation of condensate thereon. A condensate collector 1130 disposed, for example, below dehumidifying air-to-liquid heat exchanger 1100, collects liquid condensate resulting from dehumidifying the ingressing ambient air by the air-to-liquid heat exchanger. This liquid condensate is fed via a gravity feed line 331 to a condensate evaporator 335, which includes one or more adjustable heaters 336 for controlling the rate of condensate evaporation 337, and thus, the degree of re-humidifying applied to egressing exhaust air from electronics rack 800' to produce re-humidified exhaust air 806.

The dehumidifying and re-humidifying cooling apparatus further includes a controller 1140, which is coupled via data cables 1145 to rack inlet temperature and relative humidity sensors 1141 and server inlet temperature and relative humidity sensors 1142, as well as to temperature sensors 1144 sensing the temperature of system coolant being delivered to dehumidifying air-to-liquid heat exchanger 1100, and exhausting from the air-to-liquid heat exchanger via system coolant loop 1125.

In operation, humid ambient air enters through perforated front door 803, where excess moisture is condensed upon contacting the surfaces of the dehumidifying air-to-liquid heat exchanger. Heat gained is within the system coolant loop at the dehumidifying air-to-liquid heat exchanger via latent and sensible heat transfer mechanisms, and is subsequently rejected via sensible heat transfer in the auxiliary liquid-to-liquid heat exchanger 1160. Water condensate collected at the condensate collector within the perforated front door is transferred to the condensate evaporator at the rear door for re-humidifying of the egressing exhaust air passing through the perforated rear door 804. The temperature and relative humidity sensors on either side of the air-to-liquid heat exchanger collect ambient air data at the inlet of the perforated front door and the inlet to the servers, to ensure that an appropriate amount of chilled coolant is being provided to the dehumidifying air-to-liquid heat exchanger to facilitate removal of a specific amount of moisture from the air stream.

As in the embodiments of the refrigerant-cooled modules depicted in FIGS. 3A-5, the dehumidifying and re-humidifying cooling apparatus of FIG. 11 is operated to ensure that ambient air entering the electronic subsystems (e.g., servers) is appropriately dehumidified to avoid undesirable condensation of water in close proximity to electronic components.

FIG. 12 depicts an alternate embodiment of a dehumidifying and re-humidifying cooling apparatus for a liquid-cooled electronics rack such as depicted in FIGS. 8-10. In this embodiment, modular cooling unit 830 supplies chilled system coolant via a chilled coolant supply line 1171 to dehumidifying air-to-liquid heat exchanger 1100. A system coolant return line 1172 from dehumidifying air-to-liquid heat exchanger 1100 couples the air-to-liquid heat exchanger to the system water supply manifold 831 for delivery thereof via the node-to-manifold fluid connect hoses to the electronic subsystems 810 of liquid-cooled electronics rack 800". Exhaust system coolant from the electronic subsystems is returned via system water return manifold 832 in fluid communication with modular cooling unit 830 via a return line 1173. As in the other embodiments of the dehumidifying and re-humidifying cooling apparatus, ambient air passes through perforated front door 803 across dehumidifying air-to-liquid heat exchanger 1100, and through air inlet side 801 of liquid-cooled electronics rack 800", for facilitating cooling of electronic components within the rack, and is then expelled through air outlet side 802 of electronics rack 800" via a perforated rear door 804. Liquid condensate is collected in a condensate collector 803, for example, disposed at the bottom of dehumidifying air-to-liquid heat exchanger 1100, and is subsequently gravity-fed 1131 to a condensate evaporator 1135, which includes one or more water heaters 1136 for controlling the rate of evaporation 1137 of the liquid condensate at the perforated rear door 804 for re-humidifying the egressing exhaust air from the electronics rack before passing into the data center. A facility coolant loop 1150 supplies facility coolant to each MCU 830 to facilitate cooling of the system coolant flowing through the dehumidifying air-to-liquid heat exchanger and liquid-cooled electronic subsystems.

Note that in the dehumidifying and re-humidifying cooling apparatus embodiment of FIG. 12, there is no dedicated liquid-to-liquid heat exchanger or pump external to the modular cooling unit to provide the below dew point chilled coolant (e.g., water) to the dehumidifying air-to-liquid heat exchanger. In the embodiment illustrated, the modular cooling unit itself is used to chill the system coolant temperature to below a dew point temperature of the ambient air entering the electronics rack, and this chilled coolant is first passed through the dehumidifying air-to-liquid heat exchanger, and subsequently through the liquid-cooled electronic subsystems in series fluid communication with the dehumidifying air-to-liquid heat exchanger. In the embodiments of FIGS. 11 & 12, the liquid-cooled electronic subsystems can be cooled with water significantly below the data center's ambient air dew point, leading to a greater heat transfer capability of the modular cooling unit under relatively humid conditions, e.g., humidity conditions which might be out-of-specification for the electronics rack.

FIGS. 13A-16M depict various embodiments of a dehumidifying cooling apparatus, which may be used (for example) as part of the dehumidifying and re-humidifying cooling apparatuses described above. These figures illustrate various vertically-oriented, air-to-liquid heat exchanger structures and geometries for facilitating dehumidifying of air passing across the air-to-liquid heat exchanger and draining of liquid condensate from the air-to-liquid heat exchanger to a condensate collector.

Figure 13A:
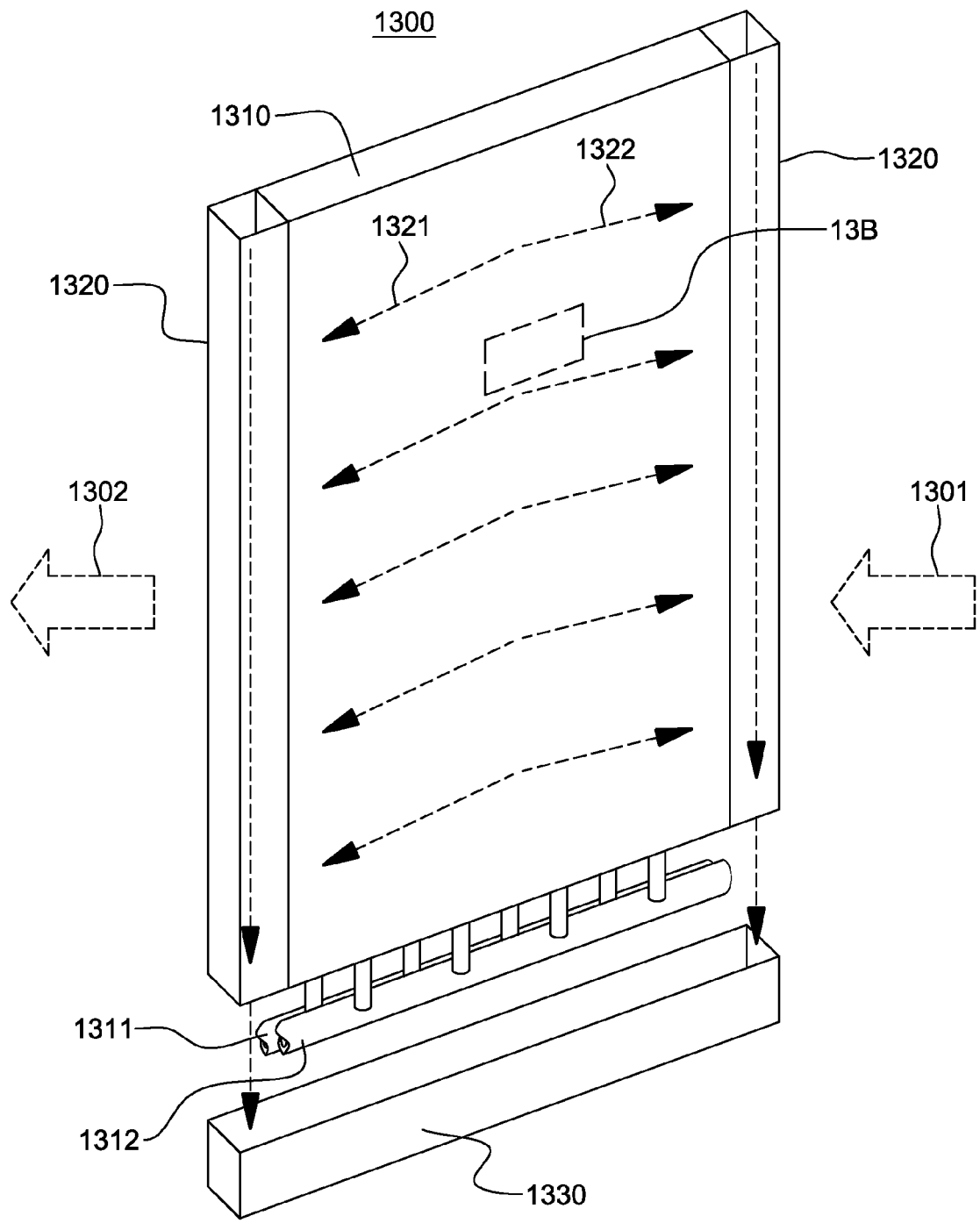
FIG. 13A depicts an embodiment of a dehumidifying cooling apparatus, in accordance with an aspect of the present invention.

FIG. 13A depicts one embodiment of a dehumidifying cooling apparatus, generally denoted 1300, in accordance with an aspect of the present invention. Dehumidifying cooling apparatus 1300 includes a vertically-oriented, air-to-liquid heat exchanger 1310, with vertical condensate drainage channels 1320 disposed at opposing vertical edges thereof. A coolant loop, which includes a coolant inlet manifold 1311 and a coolant outlet manifold 1312, supplies liquid coolant to one or more coolant-carrying channels of the air-to-liquid heat exchanger 1310.

In operation, warm (or hot) humid air 1301 passes across the air-to-liquid heat exchanger 1310, and is dehumidified and cooled by the air-to-liquid heat exchanger before egressing as cooled, dry air 1302. Dehumidification occurs when the temperature of the liquid coolant passing through the air-to-liquid heat exchanger is below a dew point temperature of the air passing across the air-to-liquid heat exchanger. When this condition exists, liquid condensate forms on the sub-ambient chilled surfaces of the air-to-liquid heat exchanger as the air passes across the heat exchanger.

The air-to-liquid heat exchanger and the dehumidifying cooling assembly of FIG. 13A are configured to facilitate drainage of liquid condensate from the air-to-liquid heat exchanger to a condensate collector 1330 disposed below the air-to-liquid heat exchanger. Drainage is facilitated by constructing the heat exchanger with a plurality of sloped surfaces to direct flow of the liquid condensate via gravity. In one embodiment, liquid condensate drains from a central region of the air-to-liquid heat exchanger in a first direction 1321 (towards a first vertical edge of the heat exchanger) and a second direction 1322 (towards a second vertical edge of the heat exchanger). As illustrated, directions 1321, 1322 are substantially orthogonal to the direction of air passing across the air-to-liquid heat exchanger. Liquid condensate draining in directions 1321 and 1322 flows to the respective vertical condensate drainage channels 1320, and pours downwards, aided by gravity, to the bottom of the heat exchanger, where it is accumulated in condensate collector 1330. Constructing the heat exchanger with sloped surfaces facilitates (in part) movement of the liquid condensate in the first and second directions 1321, 1322.

The dehumidifying cooling apparatus 1300 depicted in FIG. 13A is configured to mount to either the air inlet side or the air outlet side of an electronics rack. When mounted to the air inlet side, the dehumidifying cooling apparatus dehumidifies and cools air entering the electronics rack (e.g., via a perforated front door), and when mounted to the air outlet side of the rack, the dehumidifying cooling apparatus dehumidifies and cools exhaust air egressing from the electronics rack (e.g., via a perforated rear door). Note that the dehumidifying aspect of the dehumidifying cooling apparatus disclosed herein may be intentional, as in the case with disposition of the dehumidifying cooling apparatus at the air inlet side of the electronics rack, or may be an unintentional outcome of using the dehumidifying cooling apparatus with below dew point chilled coolant, for example, to increase cooling capability thereof, in an implementation where the dehumidifying cooling apparatus is disposed at the air outlet side of the electronics rack. Both cases result in moisture in the air stream condensing on the fin and tube surfaces of the air-to-liquid heat exchanger. Thus, there is a need for structures that facilitate drainage of water condensate from such a heat exchanger to expedite transport of the water to the condensate collector.

Figure 13B:
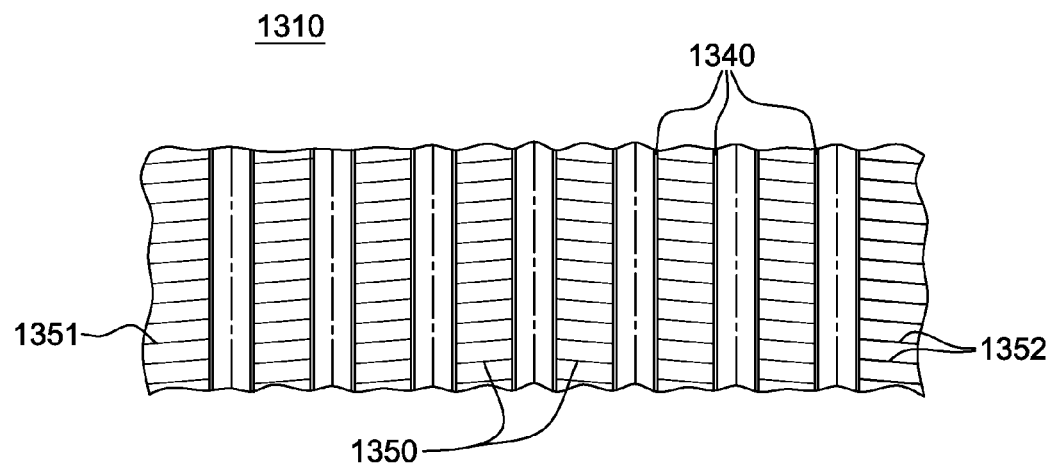
FIG. 13B is a cross-sectional depiction of a section of an air-to-liquid heat exchanger for the dehumidifying cooling apparatus of FIG. 13A, taken along line 13B-13B, in the partial plan view of the air-to-liquid heat exchanger of FIG. 13C, in accordance with an aspect of the present invention.
Figure 13C:
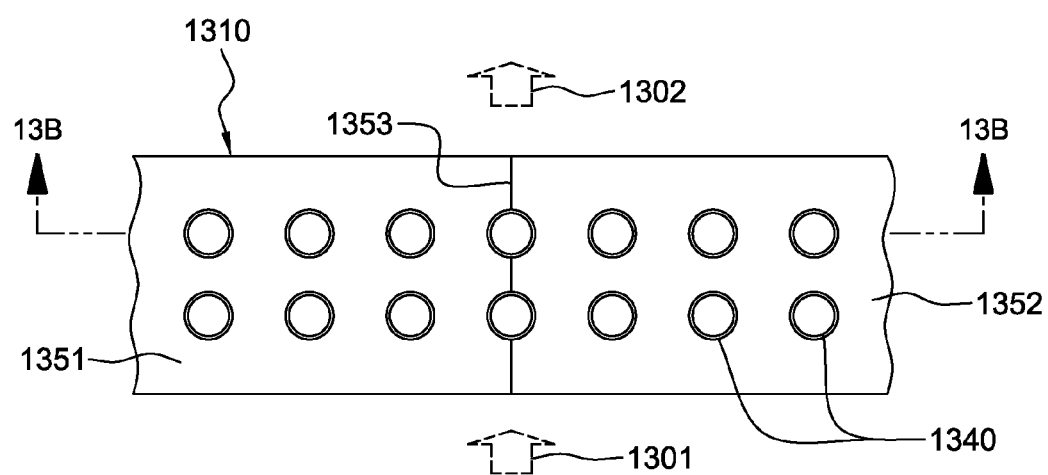
FIG. 13C is a partial plan view of the air-to-liquid heat exchanger of FIG. 13B, in accordance with an aspect of the present invention.

FIGS. 13B & 13C are partial cross-sectional elevational and plan views, respectively, of a portion of one embodiment of an air-to-liquid heat exchanger 1310, in accordance with an aspect of the present invention.

The air-to-liquid heat exchanger embodiment illustrated in FIGS. 13B & 13C includes a plurality of substantially vertically-oriented, coolant-carrying tubes 1340, and a plurality of substantially horizontally-oriented, thermally conductive fins 1350. The thermally conductive fins are shown to comprise a plurality of planar sloped surfaces 1351, 1352, which are angled to facilitate drainage of liquid condensate from a center region of the air-to-liquid heat exchanger 1310 towards the opposing vertical edges of the air-to-liquid heat exchanger (as illustrated in FIG. 13A). In this example, the plurality of planar sloped surfaces comprise sloped surfaces 1351 angled from a center 1353 (see FIG. 13C) of the heat exchanger towards a first vertical edge of the air-to-liquid heat exchanger (for facilitating transport of liquid condensate to a first vertical condensate drainage channel 1320 (FIG. 13A)), and sloped surfaces 1352 angled from the center 1353 of the heat exchanger towards the second vertical edge of the air-to-liquid heat exchanger (for facilitating transport of liquid condensate to a second vertical condensate drainage channel 1320 (FIG. 13A)).

As shown in FIG. 13C, two rows of vertically-oriented, coolant-carrying tubes 1340 are provided (by way of example only). Note that the sloped surfaces disclosed herein could be employed with various different coolant-carrying tube configurations and arrangements. In FIG. 13C, humid air 1301 is shown ingressing at the air ingress side of the air-to-liquid heat exchanger 1310, with dehumidified air 1302 egressing from the air egress side of the air-to-liquid heat exchanger 1310.

FIG. 14A depicts an alternate embodiment of an air-to-liquid heat exchanger 1400 for a dehumidifying cooling apparatus, in accordance with an aspect of the present invention. In this embodiment, air-to-liquid heat exchanger 1400 comprises a single row of vertically-oriented, coolant-carrying tubes 1440 and a plurality of thermally conductive fins 1450 contacting, surrounding and extending between vertically-oriented, coolant-carrying tubes 1440. As with the embodiment of FIGS. 13A-13C, the plurality of thermally conductive fins in the embodiment of FIG. 14A are sloped downwards in a first direction 1451 from the center 1453 to a first vertical edge of the heat exchanger, and sloped downwards from center 1453 in a second direction 1452 to a second vertical edge of the heat exchanger. The first and second directions 1451, 1452 are substantially perpendicular to the direction of air passing across the air-to-liquid heat exchanger from the air ingress side to the air egress side thereof, such as described above in connection with FIGS. 13A-13C. The sloped upper and lower surfaces of the plurality of thermally conductive fins 1450 are angled in first direction 1451 and second direction 1452 with an in-plane fin angle, as illustrated in FIG. 14B, which is chosen to facilitate drainage of liquid condensate from the heat exchanger towards its vertical edges.

As shown in FIG. 14C, the plurality of thermally conductive fins are also angled from the air ingress side (receiving ingressing air 1401) to the air egress side of the heat exchanger (through which dehumidified air 1402 egresses). This second directional angling of the sloped fin surfaces has a through-plane fin angle defined parallel to the direction of air passing across the air-to-liquid heat exchanger. Thus, in the embodiment of FIGS. 14A-14C, the plurality of thermally conductive fins are angled in an in-plane direction and in a through-plane direction, wherein the in-plane direction and the through-plane directions are perpendicular. In the example of FIG. 14C, the plurality of thermally conductive fins slope downwards from the air ingress side to the air egress side of the heat exchanger.

FIGS. 14D & 14E depict alternate embodiments of the thermally conductive fins, wherein at least one condensate collection channel is formed along an edge of the fin. In FIG. 14D, a condensate collection channel 1458 is disposed along the lower surface 1457 of the thermally conductive fin 1455 at the air egress side of the electronics rack, while in FIG. 14E, two condensate collection channels are illustrated, both at the same edge of the fin 1460, one for collecting liquid condensate from the upper surface of the fin, and the other for collecting liquid condensate forming along the lower surface of the fin. Note that, in an alternate implementation, condensate collection channel 1458 in the embodiment of FIG. 14D could be disposed along the upper surface 1456 of the thermally conductive fin 1455. FIG. 14F depicts an analogous structure to the fin structure of FIG. 14E, with the slope of the fin modified, so that the fin slopes upwards from the air ingress side to the air egress side of the air-to-liquid heat exchanger. Again, this through-plane upwards or downwards fin sloping is employed in combination with the in-plane fin angling illustrated in FIG. 14B.

The one or more condensate collection channels integrated with the fin structures in the example of FIGS. 14A-14F are designed to direct liquid condensate along the downwards slope (resulting from the in-plane fin angling) towards the vertical condensate drainage channels at the first and second vertical edges of the air-to-liquid heat exchanger (see FIG. 13A). In the embodiments illustrated in FIGS. 14D-14F, the condensate collection channels are curved lips formed integral with the planar sloped fins of the heat exchanger.

Figure 15A:
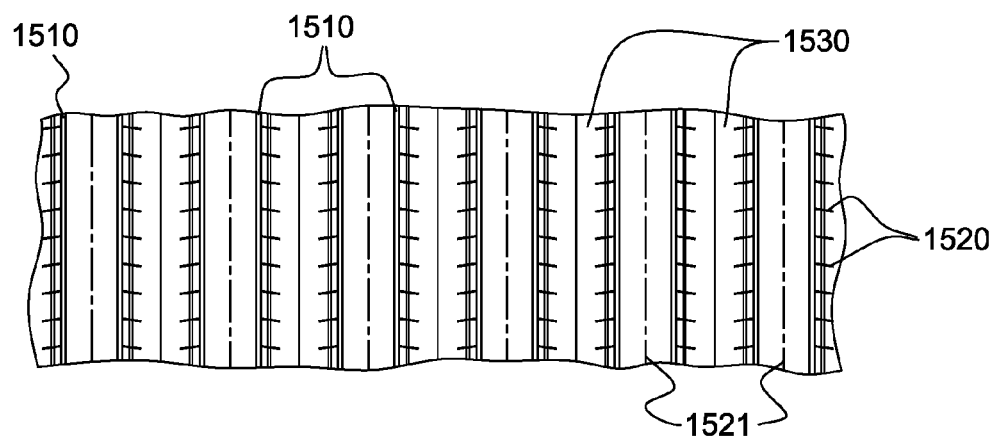
FIG. 15A is a partial cross-sectional view of an alternate embodiment of an air-to-liquid heat exchanger for a dehumidifying cooling apparatus, in accordance with an aspect of the present invention.
Figure 15B:
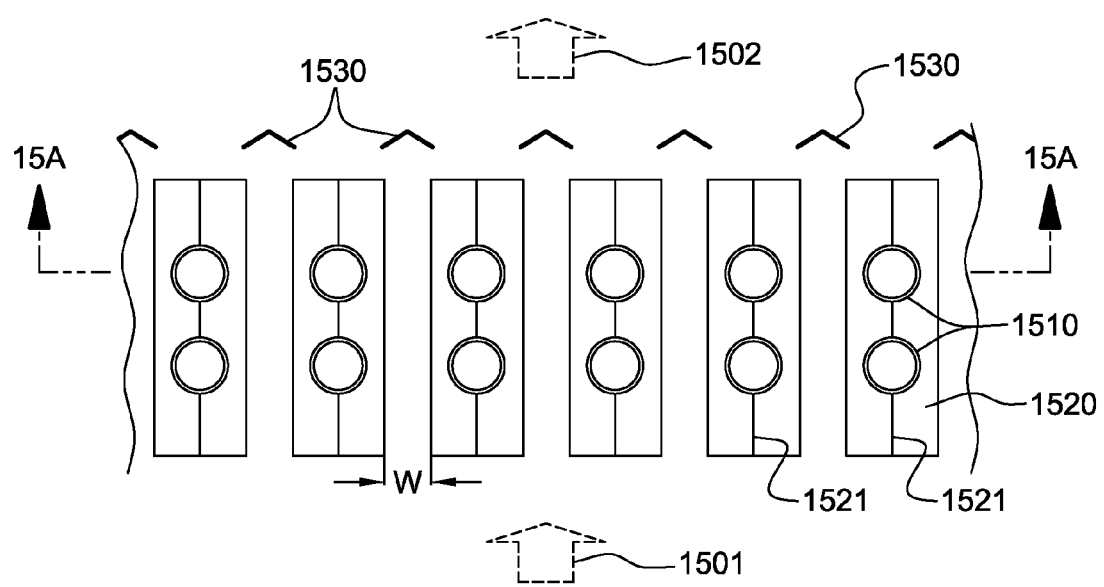
FIG. 15B is a plan view of the air-to-liquid heat exchanger of FIG. 15A, in accordance with an aspect of the present invention.

FIGS. 15A & 15B depict an alternate embodiment of an air-to-liquid heat exchanger 1500 for a dehumidifying cooling apparatus, in accordance with an aspect of the present invention. FIGS. 15A & 15B depict similar sectional views as FIGS. 13B & 13C for the heat exchanger of FIG. 13A. In this alternate embodiment, the coolant-carrying tubes 1510 are oriented vertically, and a respective plurality of substantially horizontally-oriented, thermally conductive fins 1520 contact and surround each coolant-carrying tube. In this regard, reference FIG. 15B.

In the example of FIGS. 15A & 15B, two rows of substantially vertically-oriented, coolant-carrying tubes 1510 are provided, with the through-plane adjacent coolant-carrying tubes in different rows being coupled together via a respective plurality of substantially horizontally-oriented, thermally conductive fins 1520. Each thermally conductive fin 1520 slopes downwards from a center line 1521 thereof to two opposing edges. A plurality of thermally conductive fins attach to each set of adjacent vertically-oriented, coolant-carrying tubes, and the fins slope downwards from the center of the tubes to the right and left edges of the respective fins. The result is that the in-plane fin and coolant-carrying tube subassemblies are spaced from each other by a width W. Aligned with each of these free space regions is a condensate collection baffle 1530 at the air egress side of the air-to-liquid heat exchanger. Condensate collection baffles 1530 extend vertically and serve to prevent condensed water from being carried away with the air stream exhausting from the heat exchanger. These baffles function as a backstop to collect and drain water condensate downwards, via gravity, to the bottom of the heat exchanger for collection into the condensate collector (see FIG. 13A).

FIGS. 16A-16M depict a further embodiment of a dehumidifying cooling apparatus, generally denoted 1600, in accordance with an aspect of the present invention. As explained further below in connection with FIGS. 16J-16M, this dehumidifying cooling apparatus comprises an air-to-liquid heat exchanger 1610 which utilizes a plurality of thermally conductive folded fin arrays and a plurality of rectangular-shaped, coolant-carrying tubes as the primary heat transfer structure and surfaces.

Figure 16A:
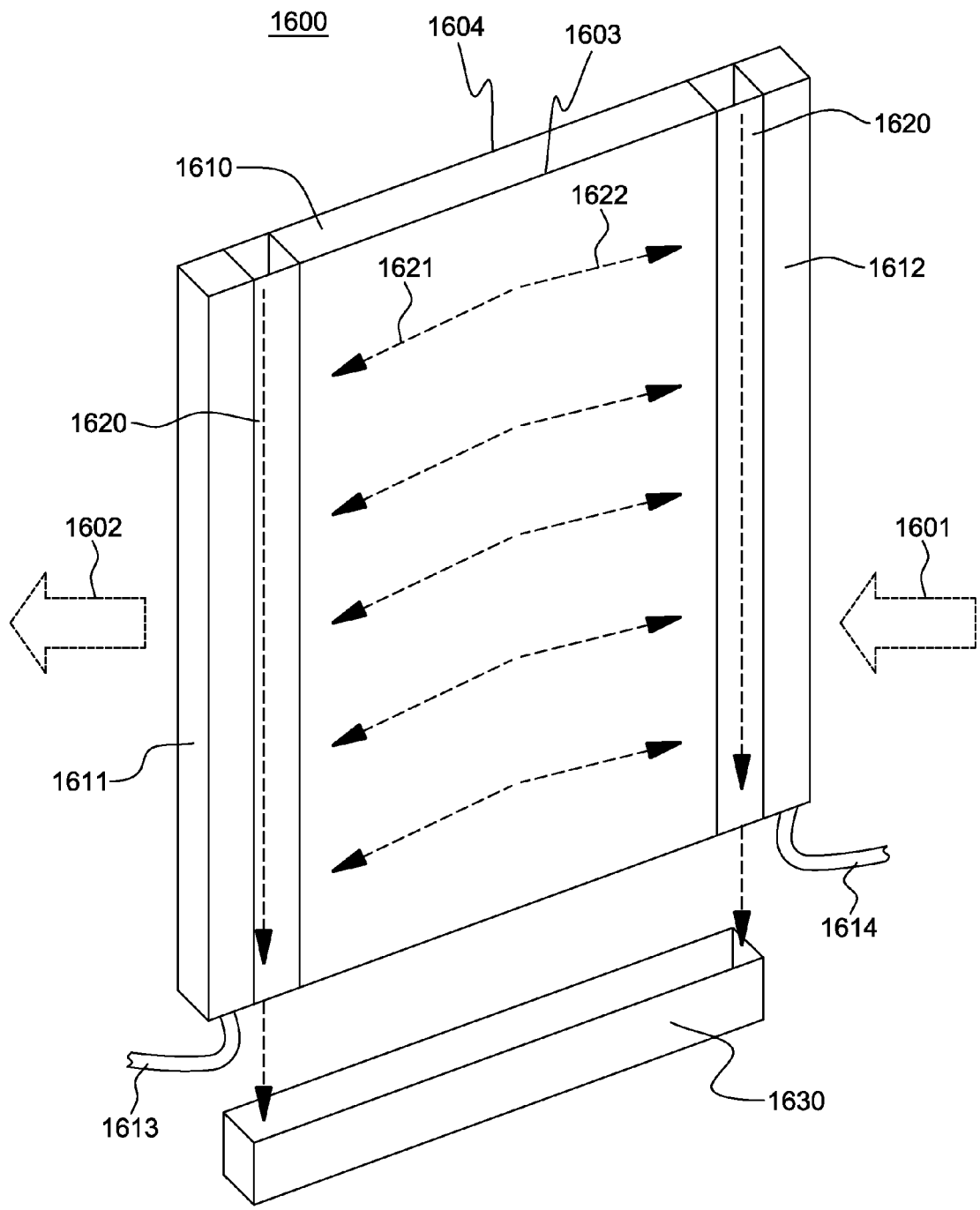
FIG. 16A depicts an alternate embodiment of a dehumidifying cooling apparatus, in accordance with an aspect of the present invention.

In FIG. 16A, air-to-liquid heat exchanger 1610 is shown oriented vertically, ready to mount to an air inlet side or an air outlet side of an electronics rack (not shown). First and second vertical condensate drainage channels 1620 are provided along the first and second vertical edges of air-to-liquid heat exchanger 1610. In addition, two vertically-oriented manifolds, a coolant inlet manifold 1611 and a coolant outlet manifold 1612, are disposed adjacent to the respective first and second vertical condensate drainage channels 1620. The coolant inlet and outlet manifolds 1611, 1612 respectively supply and exhaust coolant to and from air-to-liquid heat exchanger 1610. In one example, below dew point temperature chilled coolant is supplied to the coolant inlet manifold via a supply line 1613, and exhaust coolant exits coolant outlet manifold 1612 via a coolant return line 1614.

As illustrated by the directional arrows 1621 and 1622 in FIG. 16A, the air-to-liquid heat exchanger 1610 (described below with reference to FIGS. 16B-16M) is configured for liquid condensate to drain from a central region of the heat exchanger towards the first and second vertical edges thereof in first direction 1621 and second direction 1622, both of which are substantially perpendicular to a direction of air passing across the air-to-liquid heat exchanger. As illustrated in FIG. 16A, warm, humid air 1601 enters the air-to-liquid heat exchanger, and egresses as cool, dehumidified air 1602, wherein air ingresses and egresses across air-to-liquid heat exchanger 1610 through air ingress side 1603 and air egress side 1604, respectively. As shown, liquid condensate drains in first direction 1621 and second direction 1622 to the respective vertical condensate drainage channel 1620, where it drops via gravity, into a condensate collector 1630 disposed below air-to-liquid heat exchanger 1610.

Figure 16B:
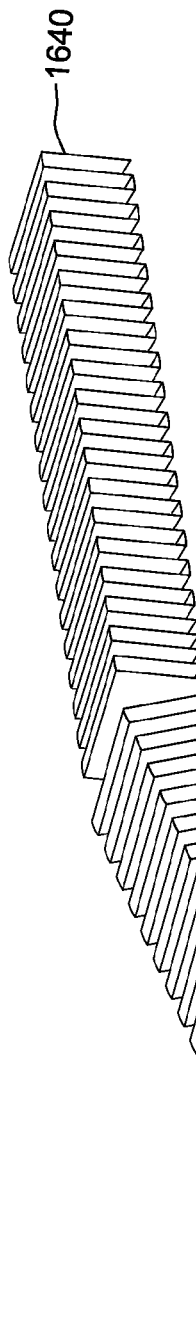
FIG. 16B depicts one embodiment of one thermally conductive folded fin array for an air-to-liquid heat exchanger of the dehumidifying cooling apparatus of FIG. 16A, in accordance with an aspect of the present invention.
Figure 16C:
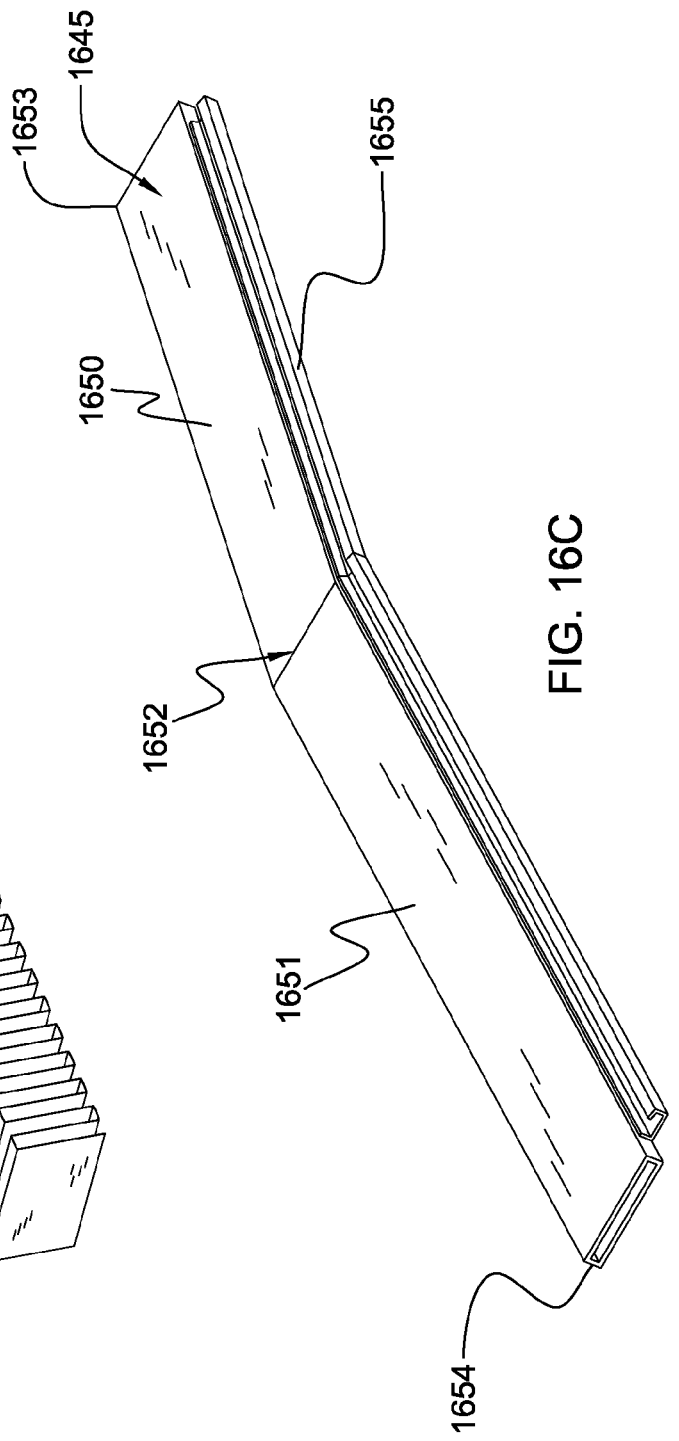
FIG. 16C depicts one embodiment of a substantially horizontally-oriented, coolant-carrying tube for an air-to-liquid heat exchanger of the dehumidifying cooling apparatus of FIG. 16A, in accordance with an aspect of the present invention.

FIGS. 16B & 16C depict one embodiment of a thermally conductive folded fin array 1640, and one embodiment of a substantially horizontally-oriented, coolant-carrying tube 1645, respectively, for an air-to-liquid heat exchanger such as depicted in FIG. 16A. The coolant-carrying tube 1645 illustrated in FIG. 16C is shown (from an air egress side of the heat exchanger) to be, in one embodiment, a bent, rectangular-shaped tube having a sloped upper surface which angles in a first in-plane direction 1650 downwards from a center 1652 of the tube towards a first end 1653 of the tube, and angles downwards in a second in-plane direction 1651 from the center 1652 of the tube to a second end 1654 of the tube. The first direction and second direction of the downwards-sloping upper surface of the coolant-carrying tube are opposite directions. Coolant-carrying tube 1645 is shown to include a condensate collection channel 1655 disposed along an edge thereof, which itself is bent from the middle towards first end 1653 and second end 1654 of the tube to facilitate collection and drainage of liquid condensate from, for example, the upper surface of the coolant-carrying tube, as well as from the thermally conductive folded fin array 1640 of FIG. 16B when coupled to the upper surface of the tube. As partially shown in FIG. 16C, first end 1653 and second end 1654 of coolant-carrying tube 1645 comprise openings which respectively enable the supply and exhaust of liquid coolant through the coolant-carrying tube.

As one fabrication example, the structure of FIG. 16C could be achieved by a straight channel tube section being bent at its midsection so that the tube is made up of two straight sections at an angle to each other, while still acting structurally as a single tube. This bending process could (in one instance) be done by inserting two mandrills into the tube from both ends until they contact each other, then affixing the tubes and the mandrills, and forcing the mandrills to rotate with the center point of the tube as the pivot point, thus forcing the tube to bend. Once the tube is bent, two pieces of a U-channel structure can be metallurgically joined to the two arms of the tubes along one edge of the bent tube to serve as the condensate collection channel to transport liquid condensate from the fins and tube to the edges of the heat exchanger. Alternatively, the U-channel structure could be made of a single piece and bent to the same angle as the bent tube, then attached to the bent tube via a bonding process (e.g., soldering, brazing, gluing, etc.).

Figure 16E:
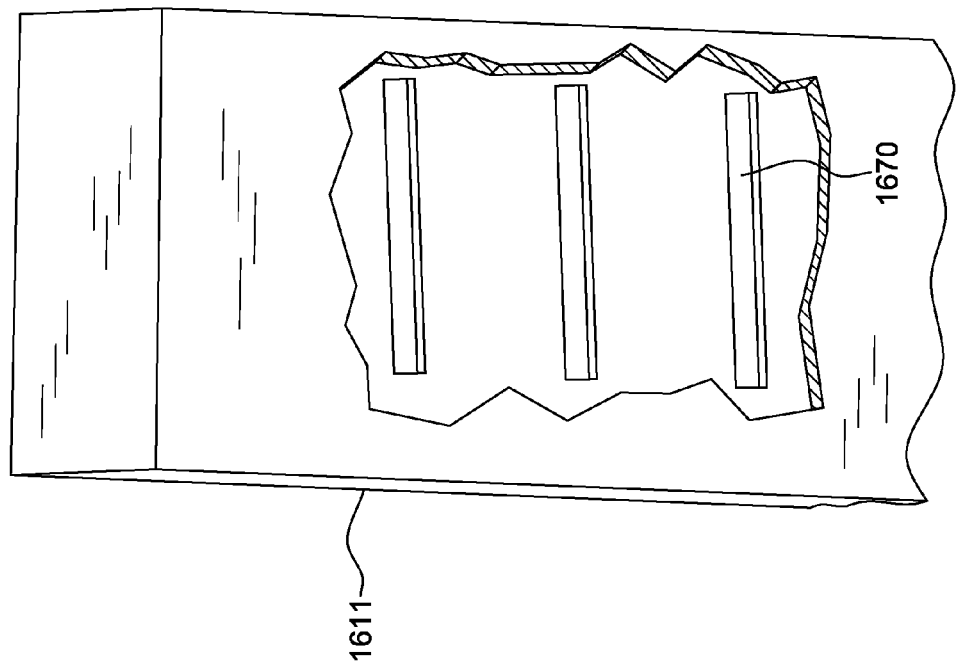
FIGS. 16D & 16E depict one embodiment of a coolant inlet manifold for the dehumidifying cooling apparatus of FIG. 16A, in accordance with an aspect of the present invention.
Figure 16D:
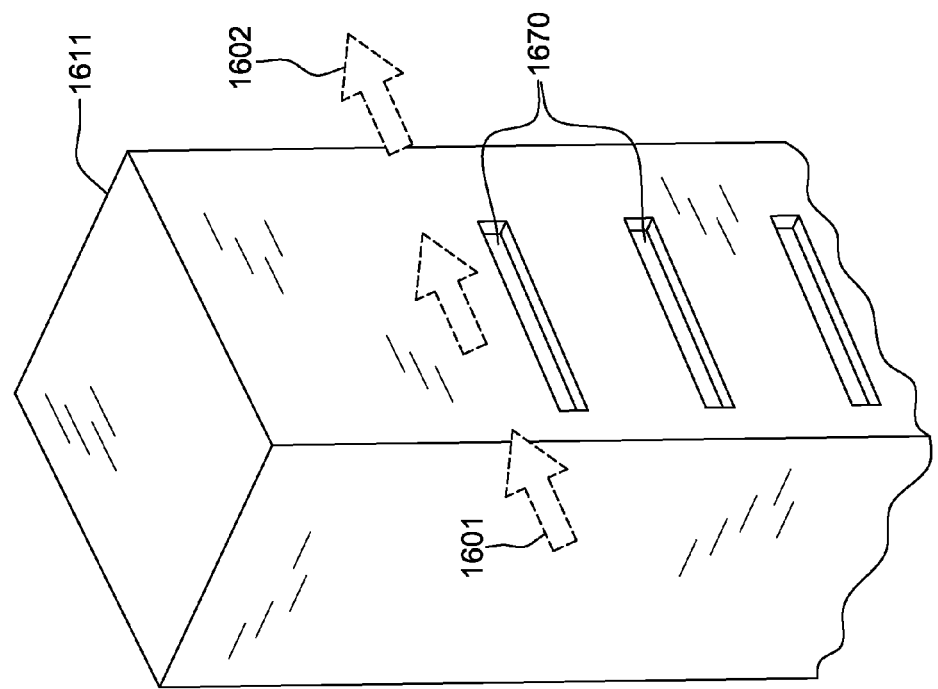

FIGS. 16D & 16E depict partial front and back views of a coolant inlet manifold 1611, such as depicted in FIG. 16A. As noted, in one embodiment, the air-to-liquid heat exchanger comprises a plurality of substantially horizontally-oriented bent tubes, such as depicted in FIG. 16C. Each bent tube is supplied coolant via the coolant inlet manifold 1611. In particular, a plurality of sloping or angled slots 1670 are provided in the back wall of the manifold, sized to receive the ends 1653 of the respective bent, coolant-carrying tubes. The sloping slots 1670 would be sealed when joined to the respective bent, coolant-carrying tubes. Note with reference to these figures, that the sloping slots angle downwards in the direction of air passing across the air-to-liquid heat exchanger, as illustrated by the ingressing air 1601 and egressing air 1602 directional arrows in FIG. 16D. The result is that the coolant-carrying tubes (such as illustrated in FIG. 16C), when assembled to the inlet manifold, tilt forwards to thereby allow gravity to direct the liquid condensate towards the condensate collection channel running along the back edge thereof. Although FIGS. 16D & 16E illustrate the openings sloping downwards from the air ingress side to the air egress side of the air-to-liquid heat exchanger, the sloping slots (or openings) could alternatively slope upwards from the air ingress side to the air egress side of the heat exchanger.

FIGS. 16F & 16G depict comparable views of the coolant outlet manifold 1612. The manifold is shown to include corresponding sloping slots 1671, which are sized and configured to sealably receive the second end 1654 (see FIG. 16C) of the coolant-carrying tubes. As with the embodiment of FIGS. 16D & 16E, the sloping slots in the coolant outlet manifold are angled downwards from the air ingress side to the air egress side of the resultant heat exchanger, that is in a direction illustrated by the ingressing air 1601 and egressing air 1602 in FIG. 16F.

FIGS. 16H & 16I depict a partial subassembly of an air-to-liquid heat exchanger, employing the coolant-carrying tube configuration of FIG. 16C, and the coolant inlet and outlet manifolds of FIGS. 16D-16G. In this partial heat exchanger embodiment, coolant-carrying tubes 1645 are shown sealed to coolant inlet manifold 1611 and coolant outlet manifold 1612. The coolant-carrying tubes 1645 are referred to herein as "substantially horizontally-oriented", since they are approximately horizontally-oriented, except for the in-plane angling in both the first in-plane direction and the second in-plane direction from the center 1652 thereof, towards the coolant inlet manifold 1611 and coolant outlet manifold 1612. More particularly, the bent, coolant-carrying tubes are angled at the first in-plane direction and the second in-plane direction perpendicular to the direction of air passing across the air-to-liquid heat exchanger (represented by the directional lines for ingressing air 1601 and for egressing air 1602).

The condensate collection channel 1655 running along the downward edge of coolant-carrying tube 1645 is illustrated in the air egress side view of FIG. 16I. In this implementation, the coolant-carrying tubes each slope in multiple directions, that is, in a first and second (in-plane) direction perpendicular to the direction of air passing across the air-to-liquid heat exchanger, and in a third (through-plane) direction parallel to the direction of air passing across the air-to-liquid heat exchanger, wherein the third direction is perpendicular to the first and second directions. This configuration advantageously allows liquid condensate to more readily drain to and through the condensate collection channels 1655 (for drainage from the heat exchanger). In one implementation, the condensate collection channels do not continue until the ends of the respective tubes, but rather, stop a distance before contacting the coolant inlet and outlet manifolds. This distance serves to create a vertical drainage passage on both the left and right sides of the tubes (at the ends of condensate collection channels) for the accumulated water condensate to fall downwards under gravity into the condensate collector disposed at the bottom of the air-to-liquid heat exchanger (see FIG. 16A).

FIGS. 16J & 16K depict similar views to FIGS. 16H & 16I of the heat exchanger subassembly, after the addition of folded fin arrays 1640 to the respective coolant-carrying tubes 1645. In this embodiment, the folded fin arrays are assumed to be attached at their top and bottom to the adjacent coolant-carrying tubes. In operation, as humid air 1601 flows through the plurality of thermally conductive folded fin arrays 1640, the air condenses on the fin and tube surfaces that are below dew point temperature of the air passing across the heat exchanger. These surfaces are chilled to below dew point temperature via the coolant passing through the coolant-carrying tubes (via manifolds 1611, 1612), which is at a temperature below the dew point temperature of the air passing across the heat exchanger.

As air flows through the air-to-liquid heat exchanger, moisture from the air condenses on the fin and tube sections which are below the dew point temperature of the air passing across the heat exchanger. The condensed water then drips down the fins in each section and falls downwards into the condensate collection channel 1655, which directs the liquid to the first and second vertical edges, for falling under gravity, into the condensate collector disposed at the bottom of the air-to-liquid heat exchanger.

FIGS. 16L & 16M depict this process in greater detail. In FIG. 16L, a subassembly of the heat exchanger is illustrated which includes coolant-carrying tube 1645 with the coolant-carrying channel 1646 thereof illustrated. Thermally conductive folded fin array 1640 is coupled to the upper surface of the coolant-carrying tube, and humid air 1601 ingresses into the folded fin array and exits as dehumidified air 1602. In FIG. 16M, the liquid condensate is shown by directional arrows 1690 dropping from the folded fin array into the condensate collection channel 1655 running along the back edge of the coolant-carrying tube 1645. Upon reaching the end of the condensate collection channel, the liquid condensate drops downwards via the respective vertical condensate drainage channel 1620 (FIG. 16A) to the condensate collector 1630 (FIG. 16A) disposed at the bottom of the heat exchanger. In one embodiment, the vertical condensate drainage channels (see FIG. 16A) may be formed via a sheet metal structure to prevent air from flowing across an area at the ends of the coolant-carrying tubes adjacent to the inlet and outlet manifolds. This vertical rectangular sheet metal forms a blockage, which in conjunction with the tubes, the gap, and vertical walls of the manifolds, creates a vertical flow passage for drainage of the accumulated water condensate to the condensate collector at the bottom of the heat exchanger.

Figure 17:
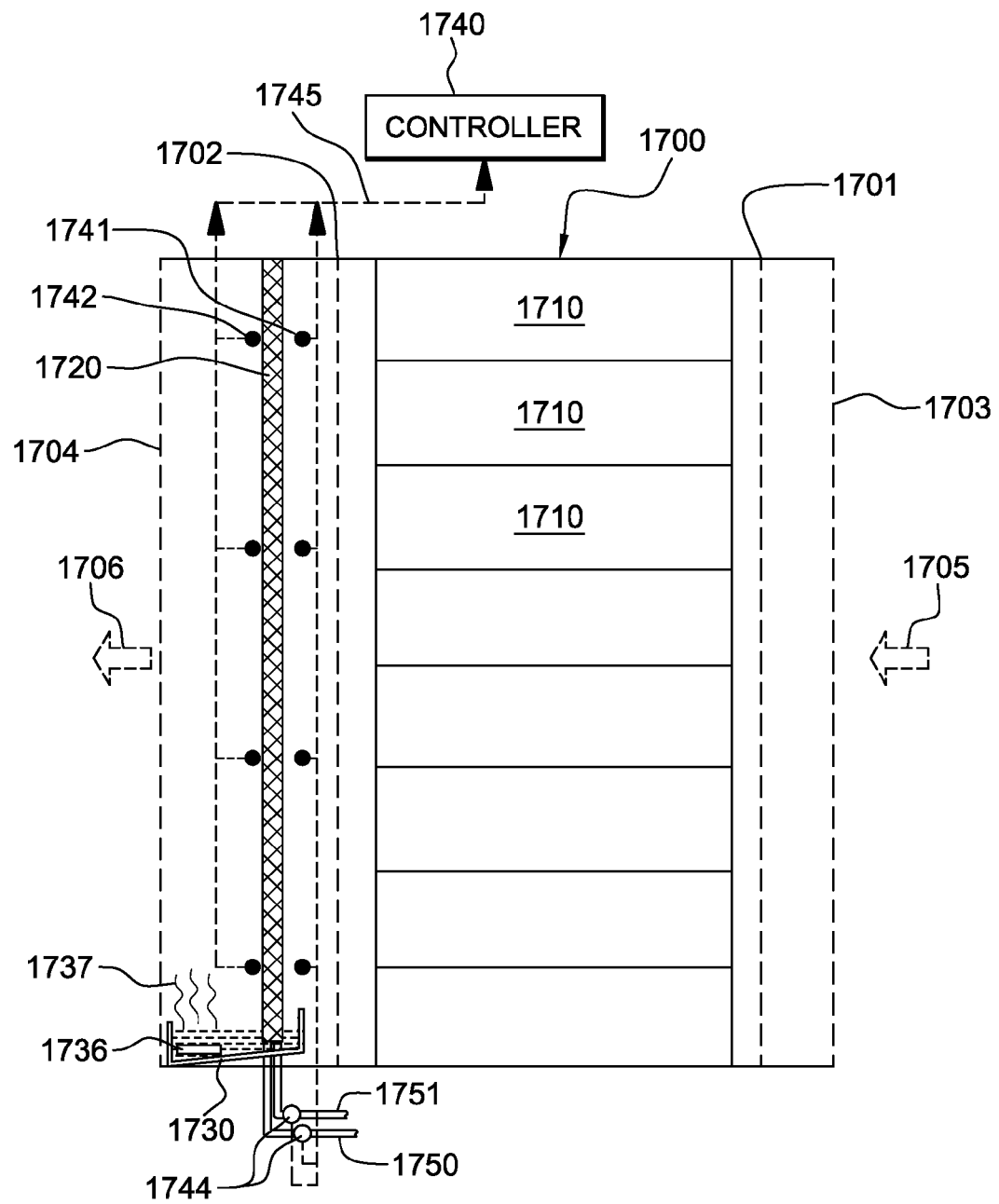
FIG. 17 is a cross-sectional elevational view of an embodiment of an electronics rack with a dehumidifying cooling apparatus, in accordance with an aspect of the present invention.

FIG. 17 is a cross-sectional elevational view of an alternate embodiment of a cooled electronic system comprising an electronics rack 1700 and a dehumidifying cooling apparatus, in accordance with an aspect of the present invention. By way of example, electronics rack 1700 may comprise a System Z® electronics rack, offered by International Business Machines Corporation, of Armonk, N.Y.

Electronics rack 1700 is shown to include one or more electronic subsystems 1710, including processor modules to be cooled. A perforated front door 1703 is coupled to an air inlet side 1701 of electronics rack 1700, and a perforated rear door 1704 is coupled to air outlet side 1702 of electronics rack 1700, wherein cool air 1705 ingresses through perforated front door 1703, passing across the electronic components within the electronics rack, and egresses as warm exhaust air. As explained further below, this warm exhaust air is cooled via an air-to-liquid heat exchanger 1720 disposed at the air outlet side 1702 of electronics rack 1700, with the result being the passage of cool exhaust air 1706 through perforated rear door 1704.

In this example, air egressing from the air outlet side 1702 of electronics rack 1700 is dehumidified via air-to-liquid heat exchanger 1720, resulting from the use of a coolant passing through the heat exchanger that is at a temperature below the air dew point. This use of below dew point temperature coolant passing through the heat exchanger advantageously significantly boosts the cooling capability of the heat exchanger, and thus provides enhanced cooling of the exhaust air before egressing from perforated rear door 1704 of the heat exchanger. In the embodiment of FIG. 17, the chilled coolant is supplied from, for example, a facility chiller unit via a coolant supply line 1750 to air-to-liquid heat exchanger 1720, and after passing through the heat exchanger, the coolant is returned via a coolant return line 1751 to the facility chiller unit.

As illustrated, a condensate collector 1730 is provided below air-to-liquid heat exchanger 1720. This condensate collector includes an evaporator region for evaporating liquid condensate, for example, via the use of one or more adjustable water heaters 1736 to evaporate 1737 the condensate into the exhaust air egressing from the air egress side of the air-to-liquid heat exchanger.

Operation of the dehumidifying cooling apparatus disclosed in FIG. 17 is facilitated via a controller 1740 coupled via data cables 1745 to a plurality of rack outlet temperature and relative humidity sensors 1741, as well as to a plurality of heat exchanger outlet temperature and relative humidity sensors 1742, and to coolant temperature sensors 1744 disposed in the coolant supply and return lines coupled to the air-to-liquid heat exchanger 1720. In one embodiment, controller 1740 is coupled to control either the temperature (or flow) of coolant into or out of the air-to-liquid heat exchanger to control the amount of dehumidifying (and cooling) applied to the air egressing from the electronics rack.

As will be appreciated by one skilled in the art, aspects of the controller described above may be embodied as a system, method or computer program product. Accordingly, aspects of the controller may take the form of an entirely hardware embodiment, an entirely software embodiment (including firmware, resident software, micro-code, etc.) or an embodiment combining software and hardware aspects that may all generally be referred to herein as a "circuit", "module" or "system". Furthermore, aspects of the controller may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus or device.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language or similar programming languages.

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An apparatus for facilitating cooling of an electronics rack, the apparatus comprising:
    an air-to-liquid heat exchanger configured to reside at an air inlet side of the electronics rack, the air inlet side and an air outlet side of the electronics rack respectively enabling ingress and egress of air through the electronics rack, the air-to-liquid heat exchanger being positioned for air passing through the electronics rack to pass across the air-to-liquid heat exchanger and being in fluid communication with a coolant loop for passing coolant through the air-to-liquid heat exchanger, the coolant passing through the air-to-liquid heat exchanger having a temperature below a dew point temperature of the air passing across the air-to-liquid heat exchanger, wherein air passing across the air-to-liquid heat exchanger is dehumidified and cooled by the air-to-liquid heat exchanger;
    a condensate collector and a condensate evaporator, the condensate collector being disposed below the air-to-liquid heat exchanger for collecting liquid condensate from the air-to-liquid heat exchanger's dehumidifying of air passing through the electronics rack, and being in fluid communication with the condensate evaporator, the condensate evaporator being disposed at the air outlet side of the electronics rack and facilitating evaporation of the liquid condensate to re-humidify air egressing from the electronics rack;
    wherein the air-to-liquid heat exchanger comprises a plurality of sloped surfaces, the plurality of sloped surfaces being angled to facilitate drainage of liquid condensate from the air-to-liquid heat exchanger to the condensate collector; and
    wherein the air-to-liquid heat exchanger comprises a plurality of coolant-carrying tubes, the plurality of coolant-carrying tubes being substantially horizontally-oriented and at least one coolant-carrying tube of the plurality of coolant-carrying tubes comprising at least one sloped surface of the plurality of sloped surfaces for facilitating drainage of liquid condensate from a central region of the air-to-liquid heat exchanger towards at least one of a first vertical edge or a second vertical edge of the air-to-liquid heat exchanger.

2. The apparatus of claim 1, wherein the at least one coolant-carrying tube of the plurality of coolant-carrying tubes comprises a condensate collection channel disposed on one edge of the at least one coolant-carrying tube for facilitating collection and drainage of liquid condensate from the air-to-liquid heat exchanger to the condensate collector.

3. The apparatus of claim 1, wherein the at least one sloped surface of the at least one coolant-carrying tube of the plurality of coolant-carrying tubes is sloped in at least one direction orthogonal to a direction of air passing across the air-to-liquid heat exchanger to facilitate drainage of liquid condensate from the central region of the air-to-liquid heat exchanger towards at least one of the first vertical edge or the vertical second edge of the air-to-liquid heat exchanger.

4. The apparatus of claim 3, wherein the at least one sloped surface of the at least one coolant-carrying tube is also sloped in another direction parallel to the direction of air passing across the air-to-liquid heat exchanger.

5. The apparatus of claim 4, wherein each coolant-carrying tube of the plurality of coolant-carrying tubes is sloped in at least one of the one direction or the another direction.

6. The apparatus of claim 1, further comprising a plurality of thermally conductive folded fin arrays, each thermally conductive folded fin array being coupled to a respective coolant-carrying tube of the plurality of coolant-carrying tubes for facilitating dehumidifying and cooling of the air passing across the air-to-liquid heat exchanger, and being bent to follow a surface of the respective coolant-carrying tube angled downwards in a first direction and a second direction towards the first vertical edge and the second vertical edge, respectively, from a central region of the air-to-liquid heat exchanger.

7. A cooled electronic system comprising:
an electronics rack, the electronics rack comprising:
an air inlet side and an air outlet side, the air inlet and air outlet sides respectively enabling ingress and egress of air through the electronics rack;
at least one electronic component requiring cooling;
at least one air-moving device, the at least one air-moving device causing air to flow from the air inlet side of the electronics rack through the electronics rack, to the air outlet side thereof; and
a dehumidifying cooling apparatus for the electronics rack, the dehumidifying cooling apparatus comprising:
an air-to-liquid heat exchanger disposed at the air inlet side of the electronics rack and positioned for air passing through the electronics rack to pass across the air-to-liquid heat exchanger, the air-to-liquid heat exchanger being in fluid communication with a coolant loop for passing coolant through the air-to-liquid heat exchanger, the coolant passing through the air-to-liquid heat exchanger having a temperature below a dew point temperature of the air passing across the air-to-liquid heat exchanger, wherein air passing across the air-to-liquid heat exchanger is dehumidified and cooled by the air-to-liquid heat exchanger;
a condensate collector and a condensate evaporator, the condensate collector being disposed below the air-to-liquid heat exchanger collecting liquid condensate from the air-to-liquid heat exchanger's dehumidifying of air passing through the electronics rack, and being in fluid communication with the condensate evaporator, the condensate evaporator being disposed at the air outlet side of the electronics rack and facilitating evaporation of the liquid condensate to re-humidify air egressing from the electronics rack;
wherein the air-to-liquid heat exchanger comprises a plurality of sloped surfaces, the plurality of sloped surfaces being angled to facilitate drainage of liquid condensate from the air-to-liquid heat exchanger to the condensate collector; and
wherein the air-to-liquid heat exchanger of the dehumidifying cooling apparatus further comprises a plurality of coolant-carrying tubes, the plurality of coolant-carrying tubes being substantially horizontally-oriented, and at least one coolant-carrying tube of the plurality of coolant-carrying tubes comprising at least one sloped surface of the plurality of sloped surfaces which facilitates drainage of liquid condensate from a central region of the air-to-liquid heat exchanger towards at least one of a first vertical edge or a second vertical edge of the air-to-liquid heat exchanger.

8. The cooled electronic system of claim 7, wherein the at least one sloped surface of the at least one coolant-carrying tube of the plurality of coolant-carrying tubes is sloped in a first direction and a second direction orthogonal to a direction of air passing across the air-to-liquid heat exchanger to facilitate drainage of liquid condensate from a central region of the air-to-liquid heat exchanger towards the first vertical edge and the second vertical edge of the air-to-liquid heat exchanger, and wherein the dehumidifying cooling apparatus further comprises at least one thermally conductive folded fin array coupled to the at least one coolant-carrying tube of the plurality of coolant-carrying tubes, and being bent to follow the at least one sloped surface of the at least one coolant-carrying tube in the first direction and the second direction towards the first vertical edge and the second vertical edge, respectively, from the central region of the air-to-liquid heat exchanger.

9. The cooled electronic system of claim 8, wherein the at least one sloped surface of the at least one coolant-carrying tube of the plurality of coolant-carrying tubes is also angled in a direction parallel to the direction of air passing across the air-to-liquid heat exchanger.

10. The cooled electronic system of claim 7, wherein the air-to-liquid heat exchanger of the dehumidifying cooling apparatus further comprises a plurality of thermally conductive folded fin arrays, each thermally conductive folded fin array being coupled to a respective coolant-carrying tube of the plurality of coolant-carrying tubes for facilitating dehumidifying and cooling of the air passing across the air-to-liquid heat exchanger.

11. A method of facilitating cooling of an electronics rack, the method comprising:
disposing a heat exchanger at an air inlet side of the electronics rack, wherein the electronics rack comprises the air inlet side and an air outlet side which respectively enable ingress and egress of air through the electronics rack, the disposing comprising positioning the air-to-liquid heat exchanger for air passing through the electronics rack to also pass across the air-to-liquid heat exchanger and coupling in fluid communication the air-to-liquid heat exchanger with a coolant loop for passing coolant through the air-to-liquid heat exchanger;
passing coolant through the air-to-liquid heat exchanger, the coolant having a temperature below a dew point temperature of the air passing across the air-to-liquid heat exchanger, wherein the air passing across the air-to-liquid heat exchanger is dehumidified and cooled by the air-to-liquid heat exchanger;
collecting liquid condensate from the air-to-liquid heat exchanger's dehumidifying of air passing through the electronics rack in a condensate collector disposed below the air-to-liquid heat exchanger, wherein the air-to-liquid heat exchanger comprises a plurality of sloped surfaces, the plurality of sloped surfaces being angled to facilitate drainage of liquid condensate from the air-to-liquid heat exchanger to the condensate collector;

evaporating the liquid condensate from a condensate evaporator disposed at the air outlet side of the electronics rack to re-humidify air egressing from the air outlet side of the electronics rack, the condensate evaporator being in fluid communication with the condensate collector to receive the liquid condensate from the condensate collector; and wherein the air-to-liquid heat exchanger comprises a plurality of coolant-carrying tubes, the plurality of coolant-carrying tubes being substantially horizontally-oriented and at least one coolant-carrying tube of the plurality of coolant-carrying tubes comprising at least one sloped surface of the plurality of sloped surfaces for facilitating drainage of liquid condensate from a central region of the air-to-liquid heat exchanger towards at least one of a first vertical edge or a second vertical edge of the air-to-liquid heat exchanger.

* * * * *